United States Patent
Yun et al.

(10) Patent No.: US 7,321,146 B2
(45) Date of Patent: Jan. 22, 2008

(54) DRAM MEMORY CELL AND METHOD OF MANUFACTURING THE SAME

(75) Inventors: Cheol-ju Yun, Kyungki-do (KR); Sun-hoo Park, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 36 days.

(21) Appl. No.: 11/352,179

(22) Filed: Feb. 10, 2006

(65) Prior Publication Data

US 2006/0124979 A1 Jun. 15, 2006

Related U.S. Application Data

(62) Division of application No. 10/704,514, filed on Nov. 7, 2003, now Pat. No. 7,030,439.

(30) Foreign Application Priority Data

Mar. 15, 2003 (KR) ............................. 2003-16302

(51) Int. Cl.
*H01L 27/108* (2006.01)

(52) U.S. Cl. ............... 257/300; 257/306; 257/E21.019; 257/E21.649; 257/E27.086; 438/253

(58) Field of Classification Search ............... 257/296, 257/300, E21.019
See application file for complete search history.

(56) References Cited

U.S. PATENT DOCUMENTS

| | | | |
|---|---|---|---|
| 5,841,195 A | 11/1998 | Lin et al. | |
| 6,100,577 A | 8/2000 | Linliu | |
| 6,136,645 A | 10/2000 | Yang et al. | |
| 6,151,244 A | 11/2000 | Fujino et al. | |
| 6,166,941 A | 12/2000 | Yoshida et al. | |
| 6,200,854 B1 | 3/2001 | Chuang | |
| 6,262,450 B1 | 7/2001 | Kotecki et al. | |
| 6,271,117 B1 | 8/2001 | Cherng | |
| 6,309,931 B1 * | 10/2001 | Hachisuka et al. | 438/278 |
| 6,381,165 B1 | 4/2002 | Lee et al. | |
| 6,498,094 B2 | 12/2002 | Nakao et al. | |

FOREIGN PATENT DOCUMENTS

KR 2001-0036183 5/2001

OTHER PUBLICATIONS

English language abstract of Korean Publication No. 2001-0036183.

* cited by examiner

*Primary Examiner*—Tu-Tu Ho
(74) *Attorney, Agent, or Firm*—Marger Johnson & McCollom, P.C.

(57) ABSTRACT

A DRAM memory cell includes a semiconductor substrate, an interlayer dielectric having storage node contact plugs that is formed on the semiconductor substrate, and storage node electrodes that are formed on the interlayer dielectric to contact the storage node contact plugs. The storage node contact plugs are formed such that an entrance portion is formed to be larger in linewidth than a contacting portions, and they are formed in gaps between the bit line structures. From a plan view perspective, the storage node electrodes of one column are offset from the storage node contact plugs in an adjacent column, such that the storage node electrodes are in a diagonal arrangement throughout the semiconductor substrate.

12 Claims, 35 Drawing Sheets

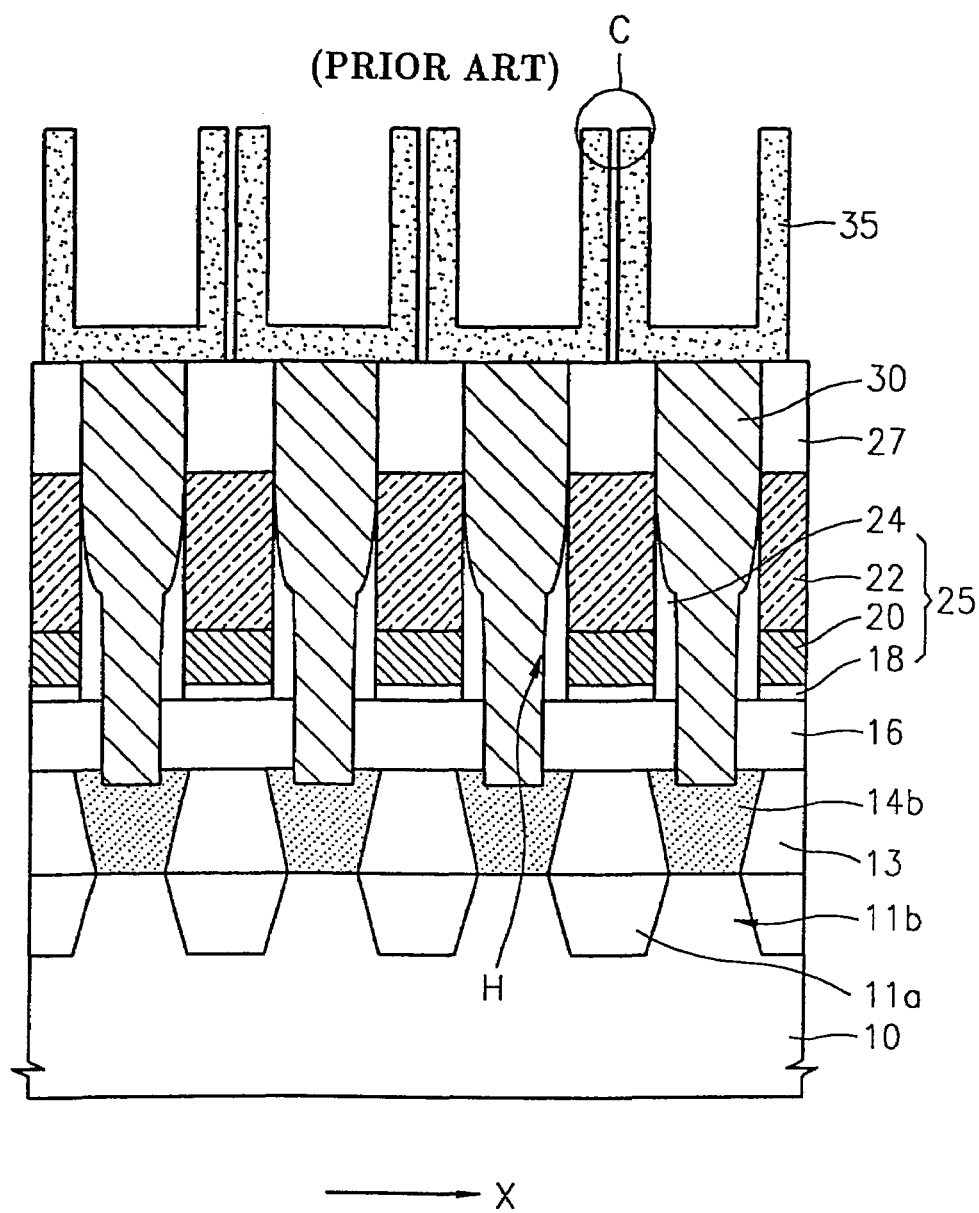

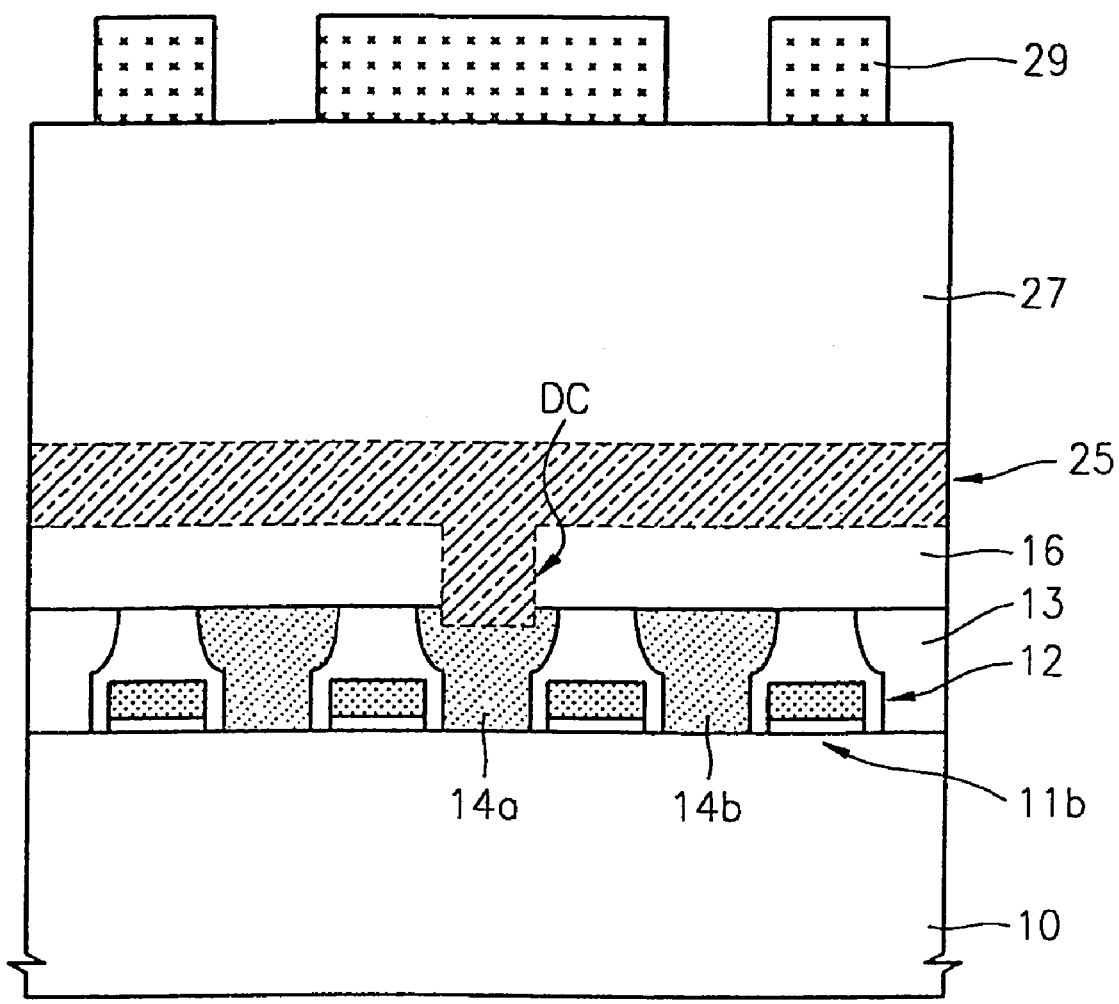

DRAM MEMORY CELL AND METHOD OF MANUFACTURING THE SAME

CROSS REFERENCE TO RELATED APPLICATIONS

This application is a Divisional of U.S. patent application Ser. No. 10/704,514, filed Nov. 7, 2003, now U.S. Pat. No. 7,030,439, which claims priority from Korean Patent Application No. 2003-16302, filed on Mar. 15, 2003, which is incorporated by reference in its entirety.

BACKGROUND OF THE INVENTION

1. Field of the Invention

This disclosure relates to a DRAM memory cell and more specifically, to a DRAM memory cell that prevents a short between storage node electrodes, and a method of manufacturing the same.

2. Description of the Related Art

As semiconductor devices become highly integrated and design rules become finer, it becomes more complicated to form patterns when manufacturing semiconductor devices. In DRAMs, even with finer patterns, the scaling of capacitances is hardly permitted. Thus, research directed at maximizing the capacitance within a small area has laboriously progressed.

Hereinafter, a method of manufacturing a conventional DRAM memory cell will be described with reference to FIGS. 1A through 1F, 2A through 2D, and 3A through 3D. FIGS. 1A through 1F are plan diagrams illustrating a method of manufacturing a conventional DRAM memory cell. FIGS. 2A through 2D are cross-sectional diagrams taken along line x-x' of FIG. 1F, illustrating a method of forming storage node contact plugs. FIGS. 3A through 3D are cross-sectional diagrams taken along line y-y' of FIG. 1F, illustrating the method of forming the storage node contact plugs.

Referring to FIG. 1A, a device isolation layer 11a is formed by a known method on a semiconductor substrate 10 to define active regions 11b where semiconductor devices will be formed. To dispose the greatest number of active regions 11b on the semiconductor substrate 10 within a limited area, parallel columns of the active regions 11b are formed on the semiconductor substrate 10 and every second column is disposed such that its active regions 11b correspond to gaps between active regions 11b in adjacent columns.

Referring to FIGS. 1B, 2A, and 3A, word line structures 12 are disposed on the semiconductor substrate 10. The word line structures 12 can extend perpendicularly to a lengthwise direction of the active regions 11b and be disposed such that a pair of word line structures 12 cross over one active region 11b. Impurity ions are implanted into the semiconductor substrate 10 on both sides of the active regions 12, thereby forming sources and drains (not shown). Next, a first interlayer dielectric (ILD) 13 is deposited on the resultant structure of the semiconductor substrate 10 and then etched until the sources and drains (not shown) are exposed, thereby forming contact holes (not shown). Here, the contact holes are formed in a self-aligned manner by means of the word line structures 12. Thereafter, the contact holes, formed in the first ILD 13, are filled with a conductive layer, for example, a doped polysilicon layer, to form first contact pads 14a and second contact pads 14b. Here, the first contact pads 14a contact the drains, while the second contact pads 14b contact the sources.

Continuing to refer to FIGS. 2A and 3A, a second ILD 16 is deposited on the first ILD 13. Next, the second ILD 16 is etched until the first contact pads 14a are exposed (see FIG. 1D). In FIG. 1D, reference character "A" refers to the exposed first contact pads 14a. A barrier metal layer 18, a metal layer 20 for bit lines, and a hard mask layer 22 are sequentially stacked on the second ILD 16 to contact the exposed first contact pads A. Afterwards, a photoresist pattern 24 is formed on the hard mask layer 22 to define bit line structures.

Next, as shown in FIGS. 2B and 3B, the hard mask layer 22, the metal layer 20 for the bit lines, and the barrier metal layer 18 are patterned in the shape of the photoresist pattern 24.

Next, as shown in FIGS. 1E, 2C, and 3C, bit line spacers 24 are formed by a known method on both sidewalls of the patterned hard mask layer 22, metal layer 20 for the bit lines, and barrier metal layer 18, thereby forming bit line structures 25. The bit line structures 25 are formed perpendicularly to the word line structures 12 and electrically contact the exposed first contact pads A. In FIG. 3C, which is a cross-sectional diagram taken in a direction parallel to the bit line structures 25, an entire bit line structure 25 is represented with dotted and solid lines. Also, in FIG. 3C, the reference character "DC" denotes a bit line contact region where a bit line 25 contacts a first contact pad 14a. A third ILD 27 is formed on the resultant structure of the semiconductor substrate 10 where the bit lines 25 are formed. Next, although not shown in the drawings, a photoresist pattern 29 is formed on the third ILD 27 so as to expose the second contact pads 14b.

As shown in FIGS. 1F, 2D, and 3D, the third ILD 27 and the second ILD 16 are anisotropically etched using the photoresist pattern 29 as an etch mask, thereby forming storage node contact holes H (FIG. 2D). Once the storage node contact holes H are formed, the surfaces of the second contact pads 14b are exposed. In FIG. 1F, reference character "B" refers to the exposed surface of a second contact pad 14b. The storage node contact holes H are formed in a self-aligned manner by means of the bit line structures 25. In a view taken in a direction parallel to the word line structures 12, the storage node contact holes H are formed along the sidewalls of the bit line structures 25 (FIG. 2D), while in a view taken in a direction parallel to the bit line structures 25, they are formed in the shape of straight lines, as shown in FIG. 3D.

Thereafter, the storage node contact holes H are filled with a conductive material, thereby forming storage node contact plugs 30. Since each of the storage node contact plugs 30 is formed at each position "B" shown in FIG. 1F, the storage node contact plugs 30 are disposed densely such that one bit line 25 is interposed between every two storage node contact plugs 30. Next, as shown in FIGS. 2D and 3D, cylindrical storage node electrodes 35 are formed by a known method to contact the storage node contact plugs 30. The storage node electrodes 35 may be formed to be greater in size than the storage node contact plugs 30. As long as a short does not occur between adjacent storage node electrodes 35, the storage node electrodes 35 are formed to be as large as possible.

However, in the foregoing DRAM memory cell, the storage node electrodes 35 are bordered by the word line structures 12 and the bit line structures 25 and formed in a matrix shape. Thus, even a slight misalignment may cause a short between adjacent storage node electrodes 35. Further, as the diameter of a storage node electrode 35 is larger than that of a storage node contact plug 30, a short between adjacent storage node electrodes 35, which is referred to as "C" in FIG. 2D, is highly likely to occur.

Also, with an increase in capacitance of semiconductor devices, the storage node electrodes 35 must be larger in size. Thus, methods for expanding the sizes of the storage node contact plugs 30 and the storage node electrodes 35 have been developed. However, as shown in FIGS. 1F and 2D, extending the storage node contact plugs 30 and the storage node electrodes 35 in an X-axis direction is reaching the technical limit.

Further, as shown in FIGS. 1F and 2D, extending the storage node contact plugs 30 and the storage node electrodes 35 in a Y-axis direction may cause them to contact adjacent bit line contact region DC. Also, in this case, while the storage node contact holes H are being formed, the word line structures 12 may be damaged.

The foregoing problems hinder the manufacture of high-capacitance storage node electrodes. Embodiments of the invention address these and other problems in the conventional art.

SUMMARY OF THE INVENTION

According to embodiments of the invention, while the diameter of the contacting portion of a storage node contact plug remains the same as a conventional storage node contact plug, the diameter of the entrance portion of the storage node contact plug extends in a direction parallel to the bit lines. Also, embodiments of the invention provide storage node electrodes in the same row that are disposed in a zigzag fashion so that the storage node electrodes throughout the substrate are diagonally arranged. Thus, a predetermined margin between adjacent storage node electrodes can be secured in the X-axis and Y-axis directions. Consequently, reliable insulation is enabled between the adjacent storage node electrodes, and the storage node electrodes can be increased in size.

BRIEF DESCRIPTION OF THE DRAWINGS

The above and other features and advantages of the invention will become more apparent by describing in detail preferred embodiments thereof with reference to the attached drawings.

FIGS. 2A through 2D are cross-sectional diagrams taken along line x-x' of FIG. 1F, illustrating a method of forming storage node contact plugs.

FIGS. 3A through 3D are cross-sectional diagrams taken along line y-y' of FIG. 1F, illustrating the method of forming the storage node contact plugs.

DETAILED DESCRIPTION OF THE INVENTION

Figure 1A:
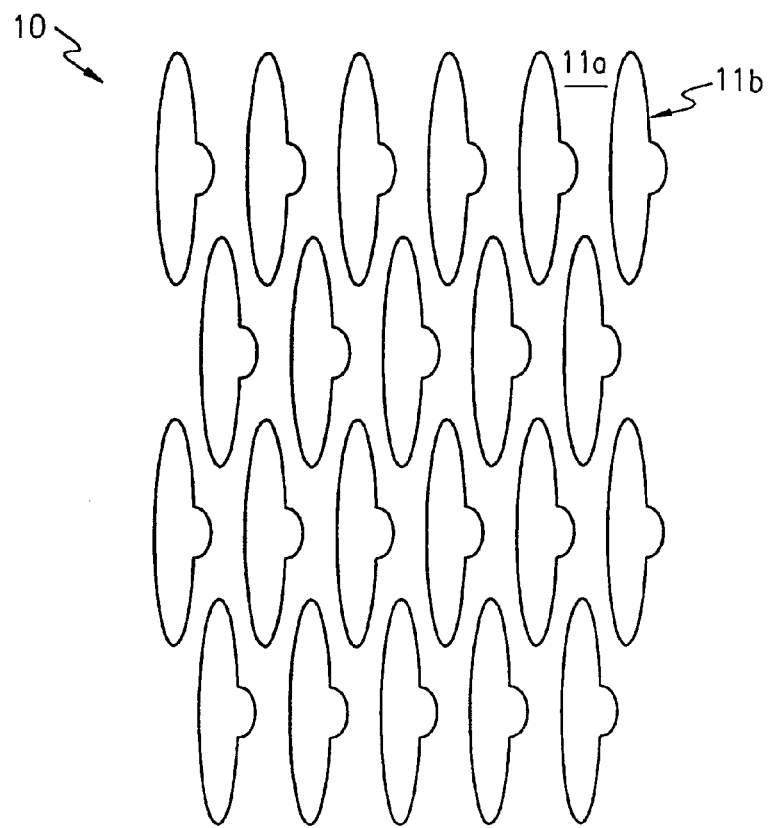
FIGS. 1A through 1F are plan diagrams illustrating a method of manufacturing a conventional DRAM memory cell.
Figure 1B:
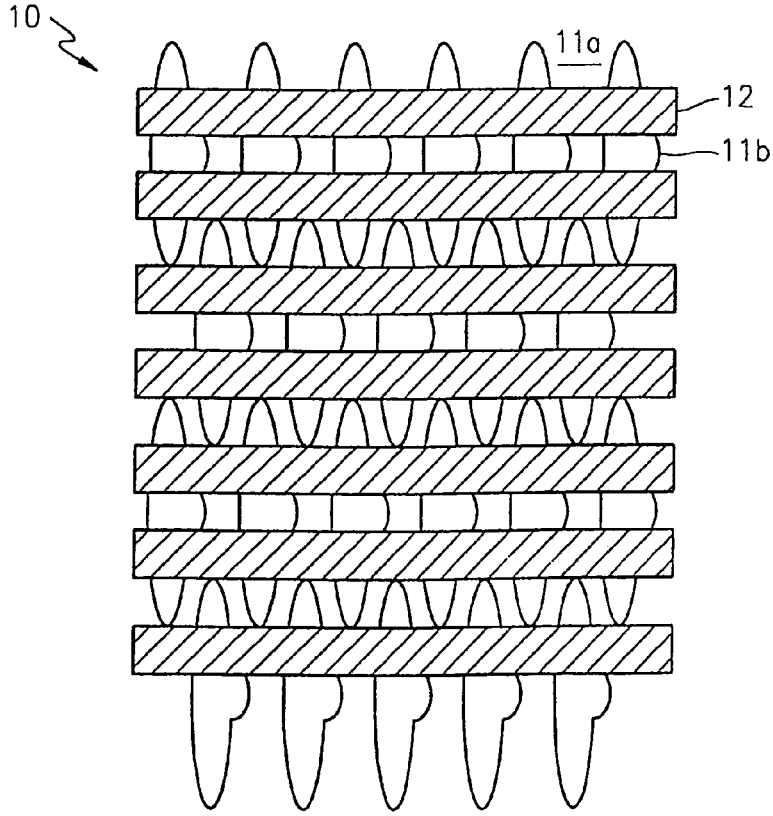
Figure 1C:
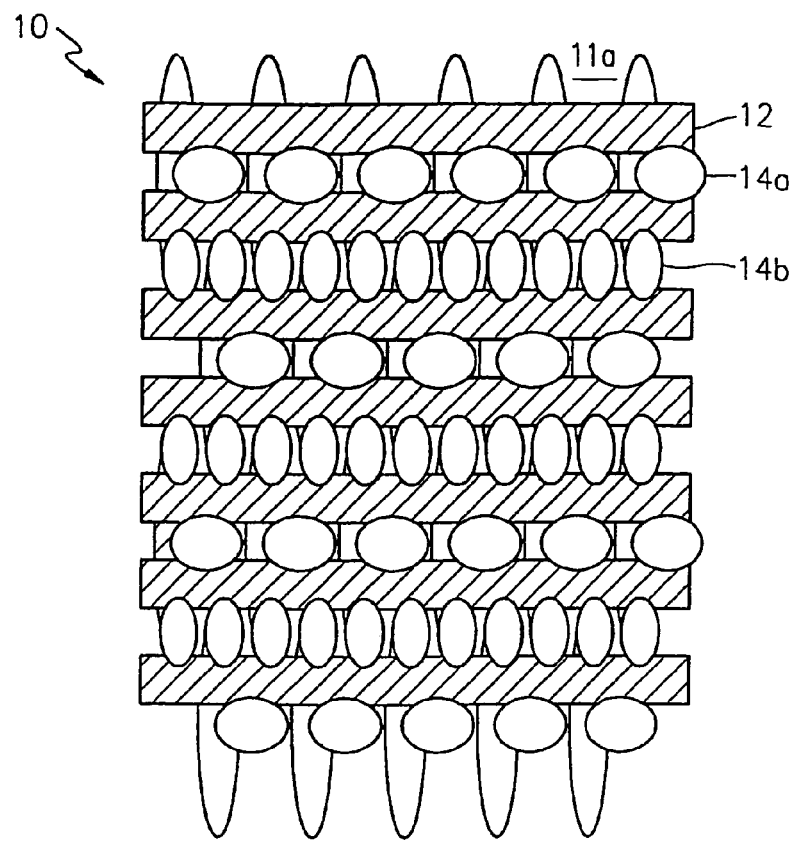
Figure 1D:
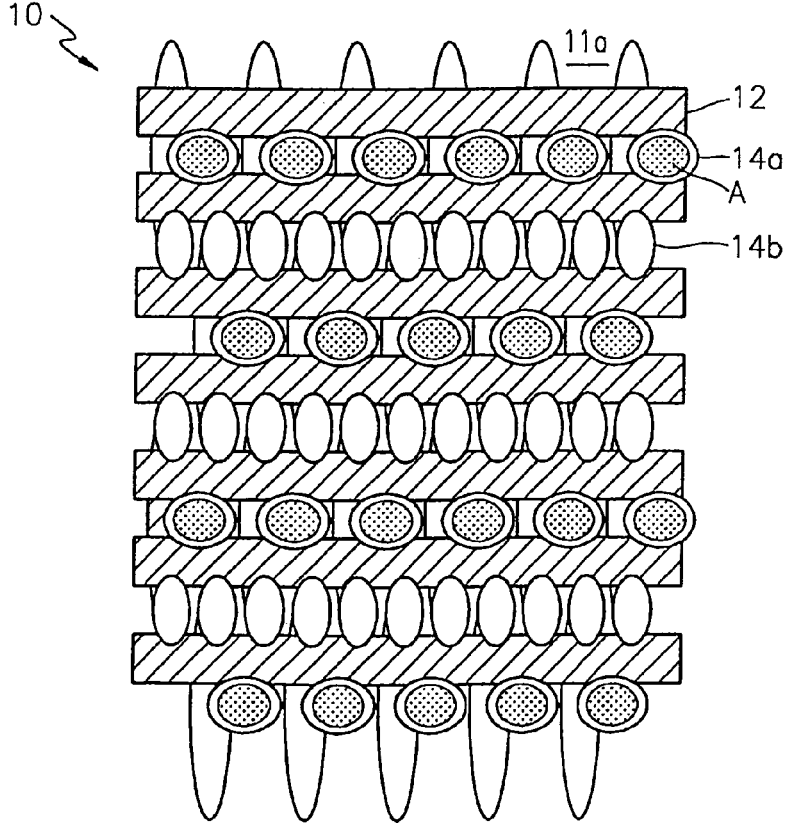
Figure 1E:
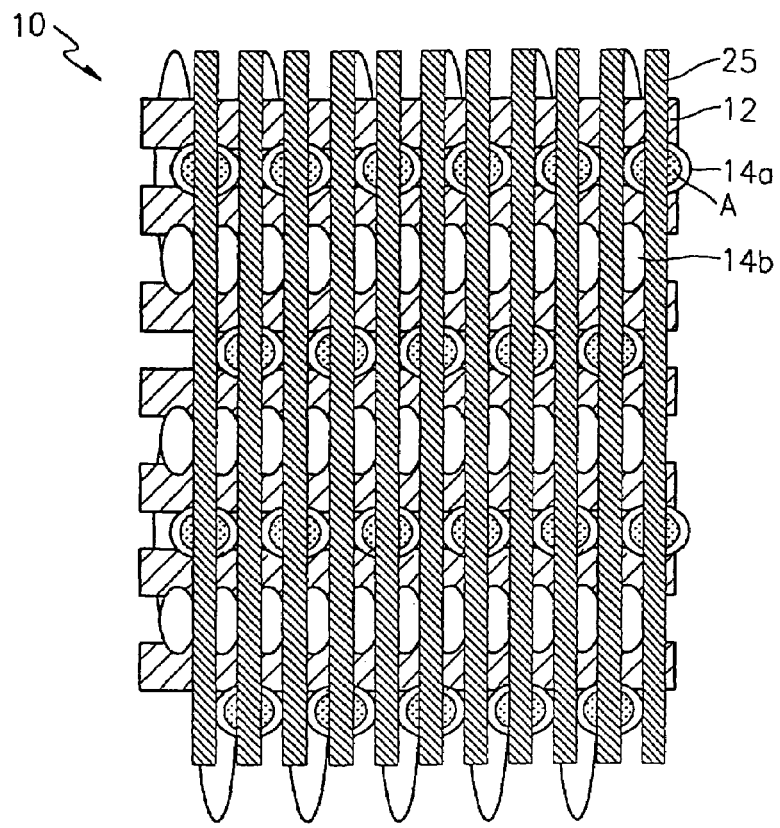
Figure 1F:
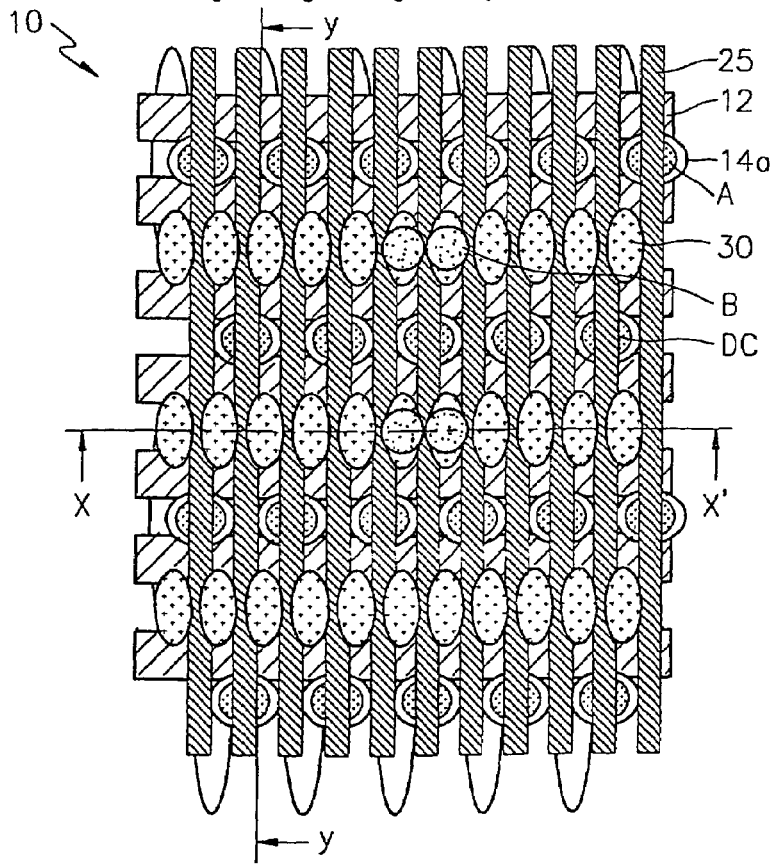
Figure 1F:
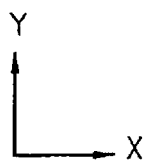
Figure 2A:
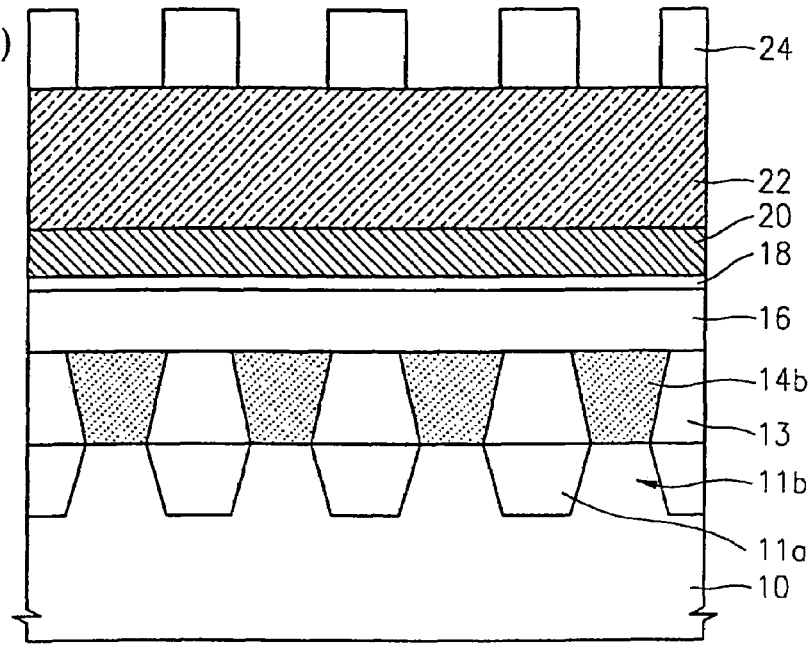
Figure 2B:
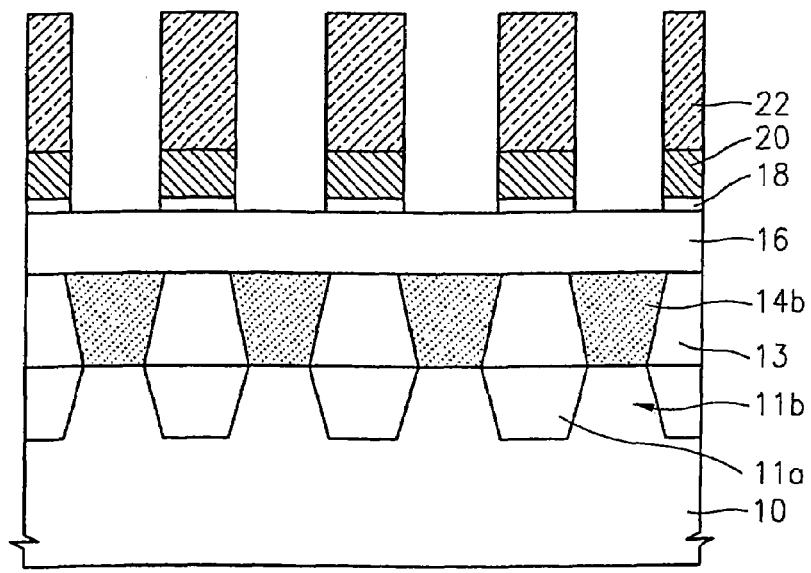
Figure 2C:
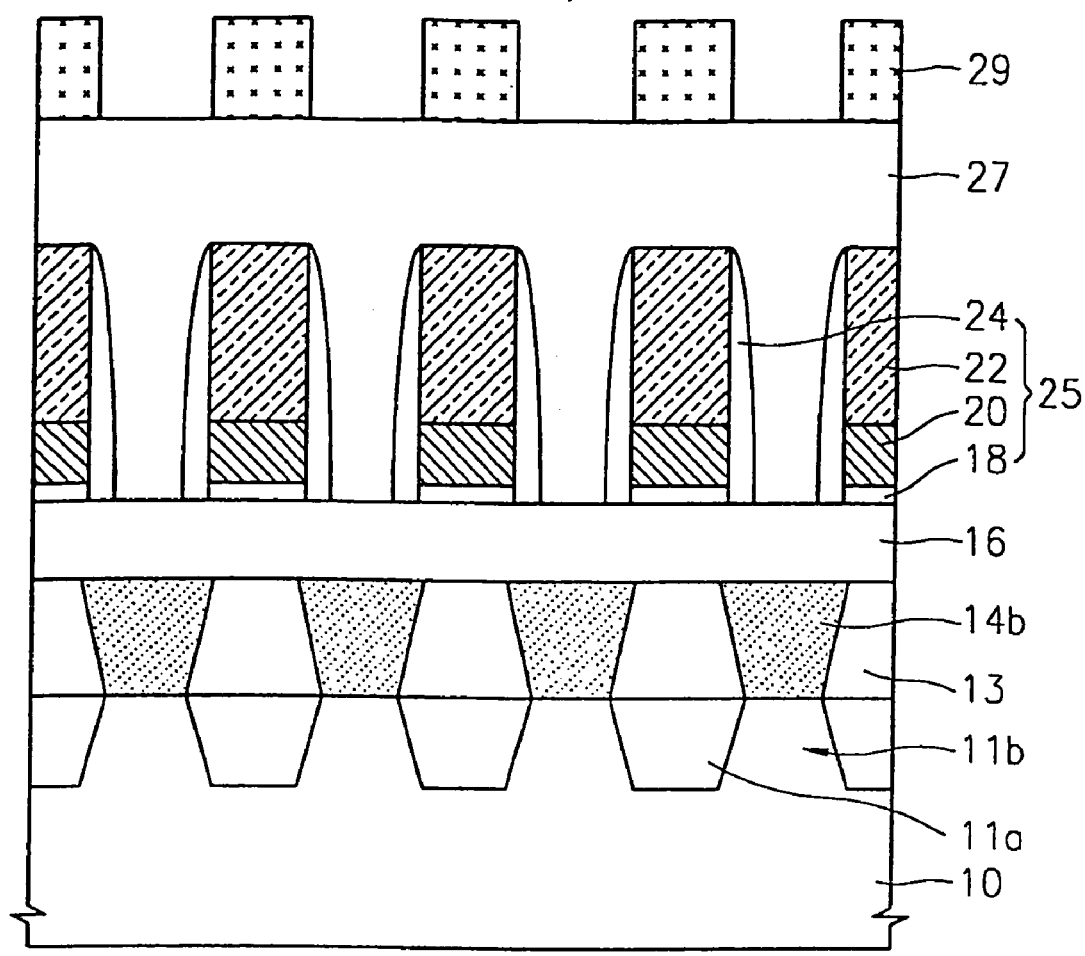
Figure 3A:
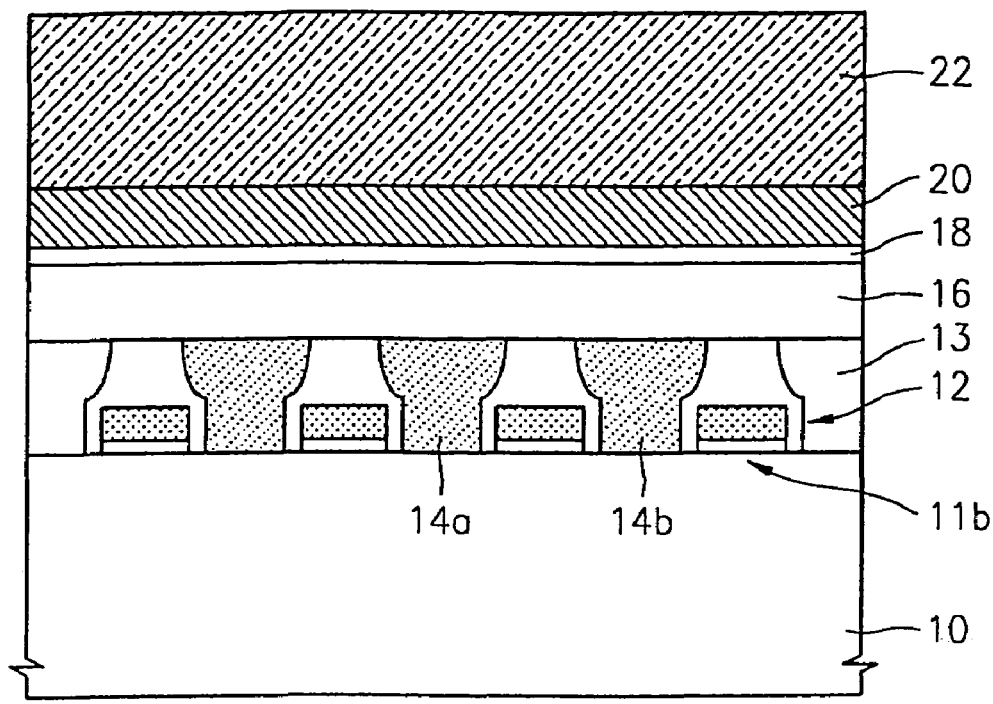
Figure 3B:
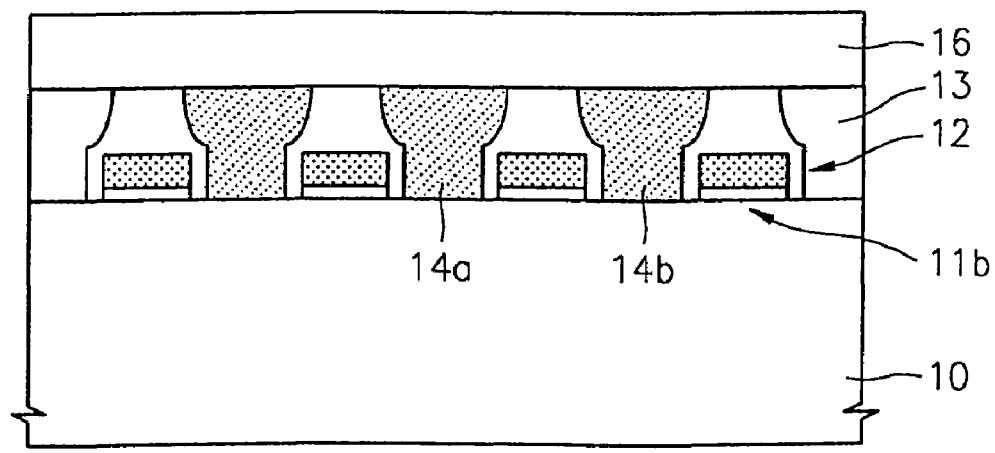
Figure 3D:
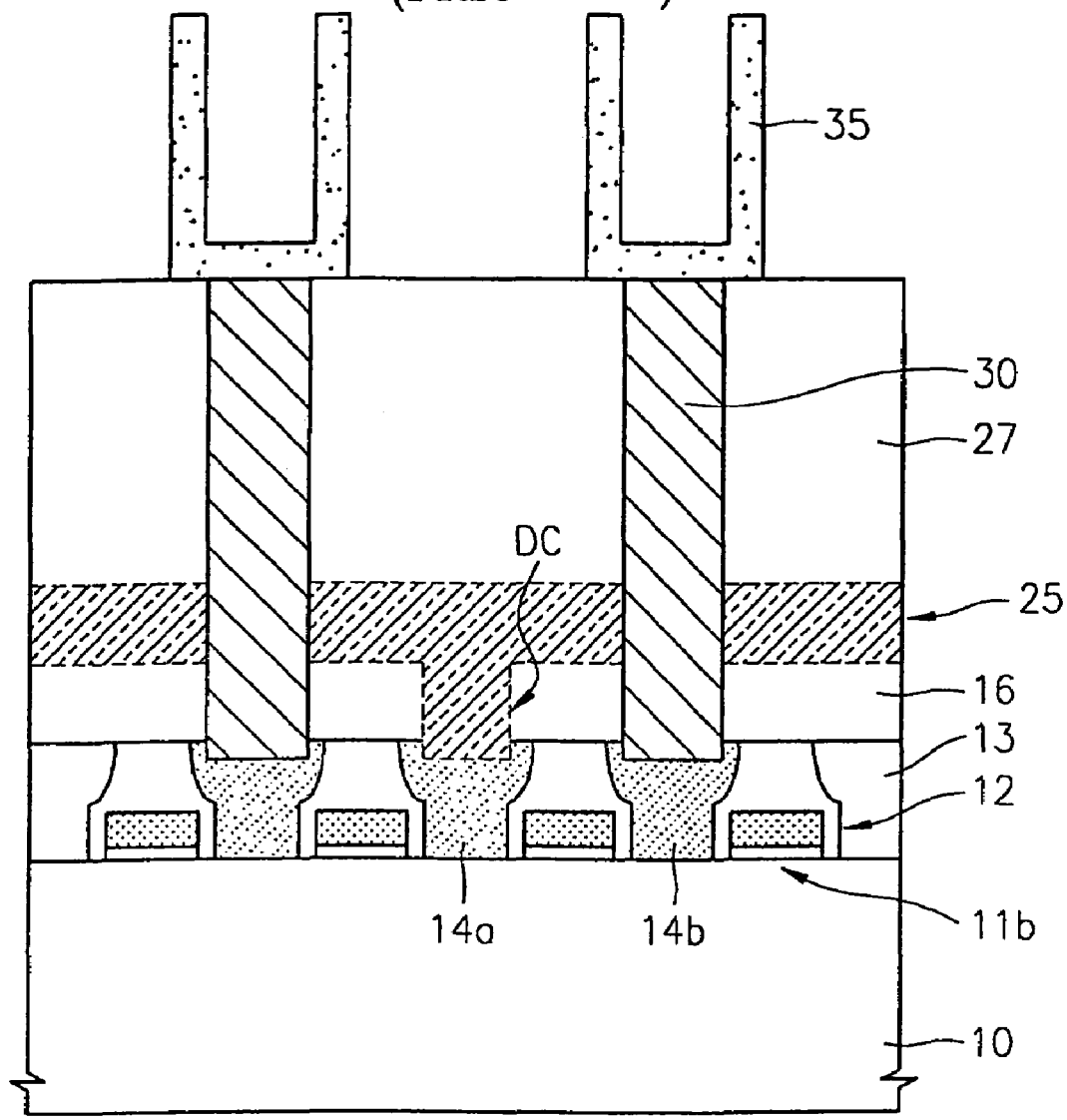

The invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art. In the drawings, the shape of elements is exaggerated for clarity, and the same reference numerals in different drawings represent the same element.

Figure 4:
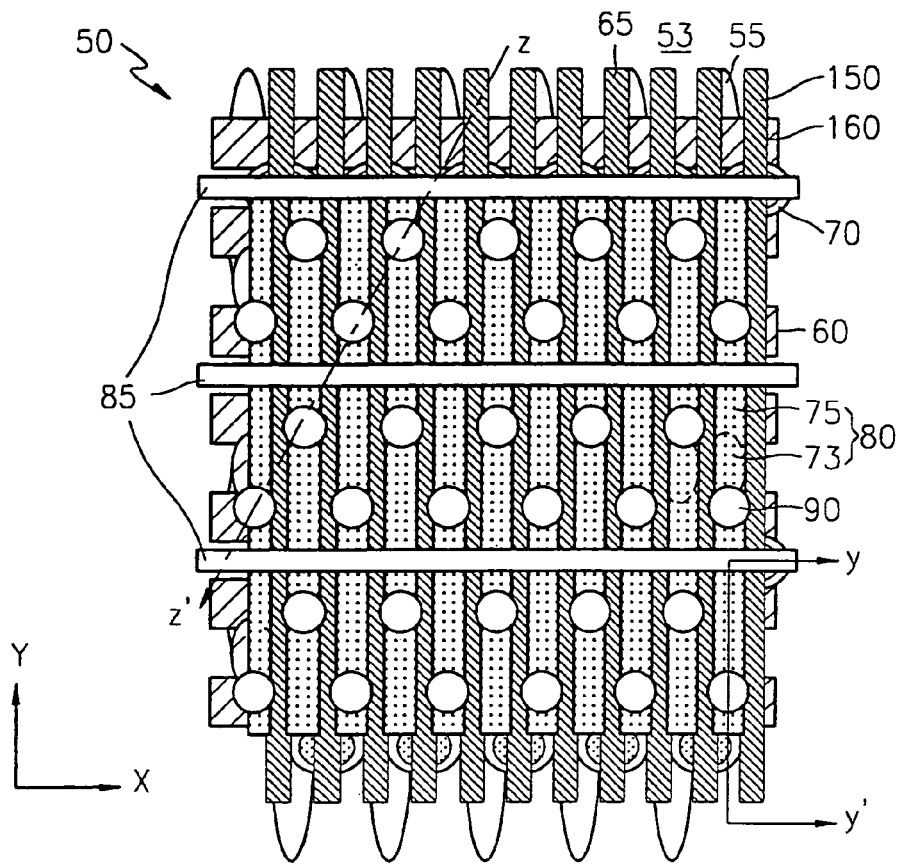
FIG. 4 is a plan diagram illustrating a DRAM memory cell according to an embodiment of the invention.

FIG. 4 is a plan diagram of a DRAM memory cell according to an embodiment of the invention.

Referring to FIG. 4, a device isolation layer 53 is formed on a predetermined portion of a semiconductor substrate 50 to define active regions 55. Like the active regions 11b shown in FIG. 1A, the active regions 55 are each formed approximately like a "T" shape that is rotated by 90° and disposed such that the active regions 55 in every column protrude into the gaps between the active regions 55 in an adjacent column. A plurality of word line structures 60 are disposed on the semiconductor substrate 50 and extend in a row along the X-axis direction of FIG. 4. In FIG. 4, the X-axis direction and the Y-axis direction are arbitrarily set for ease of explanation. A word line structure 60 is a word line wrapped by an insulator, and a plurality of word line structures are disposed to cross over one active region 55. Drains and sources (not shown) are formed in the active regions 55 on both sides of the word line structures 60, first contact pads and second contact pads (not shown) are formed to contact the drains and sources, respectively. Every first contact pad is formed in a gap between a pair of word line structures 60 crossing over one active region 55 and every second contact pad is formed on the outer portion of the pair of word line structures 55. The first contact pads contact the drains and the second contact pads contact the sources.

Bit line structures 65 are formed perpendicular to the word line structures 60 and are electrically connected to the first contact pads. The bit line structures 65 are electrically insulated from the word line structures 60 by means of an ILD interposed between the bit line structures 65 and the word line structures 60. A bit line structure 65 is a bit line wrapped by an insulator, and reference numeral "70" denotes a portion where a first contact pad contacts a bit line structure 65, i.e., a bit line contact.

Figure 5:
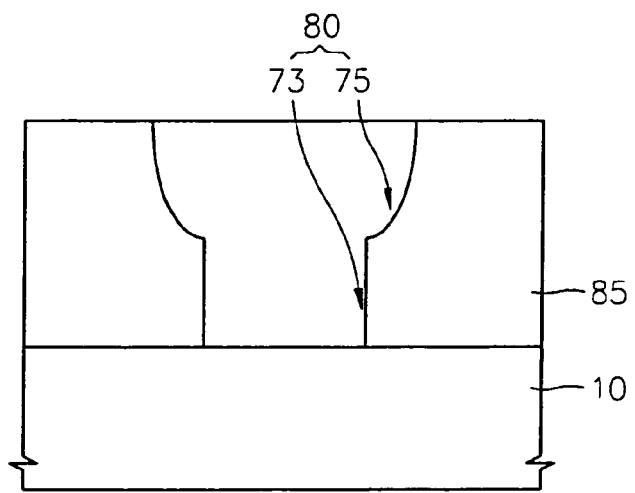
FIG. 5 is a cross-sectional diagram taken along line y-y' of FIG. 4.

Storage node contact plugs 80 are formed in positions corresponding to the second contact pads and electrically connected to the second contact pads. Referring to FIG. 5, in a view taken in a direction parallel to the bit line structures 65, i.e., in the Y-axis direction, the storage node contact plugs 80 are formed in a "Y" shape such that the diameter of their entrance portions 75 is larger than that of their contacting portions 73. The contacting portions 73 are portions where the storage node contact plugs 80 contact the second contact pads, whereas the entrance portions 75 are portions where the storage node contact plugs 80 will contact the storage node electrodes. In a direction parallel to the word line structures 60, i.e., in the X-axis direction, the storage node contact plugs 80 are formed between the bit line structures 65 and are electrically isolated from adjacent storage node contact plugs 80 by the bit line structures 65. In the Y-axis direction, the storage node contact plugs 80 are electrically isolated from an ILD 85.

In a conventional storage node contact plug, the diameter of the entrance portion is equal to that of the contacting portion. According to embodiments of the invention, however, although the diameter of the contacting portion 73 is equal to that of the entrance portion or the contacting portion of the conventional storage node contact plug, the diameter of the entrance portion 75 extends in the Y-axis direction. Thus, shorts are prevented between the storage node contact plugs 80 and the bit line structures 65, and from a plan view perspective, the area of the storage node plugs 80 is increased.

Next, storage node electrodes 90 are formed on the storage node contact plugs 80. The storage node electrodes 90 may be formed as a concave type or a cylindrical type. Here, the storage node electrodes 90 in a column are arranged diagonally with respect to the storage node electrodes 90 in a neighboring column. In other words, if the storage node contact plugs 80 are separated into rows by the ILDs 85, the odd-numbered (or even-numbered) column of storage node electrodes 90 are disposed to contact a lower portion of the storage node contact plugs 80. Similarly, the even-numbered (or odd-numbered) column of storage node electrodes 90 disposed to contact an upper portion of the storage node contact plugs 80. Consequently, the storage node electrodes are disposed in a diagonal pattern (in a z-z' direction of FIG. 4) throughout the semiconductor substrate 50. This arrangement of the storage node electrodes 90 is possible because the entrance portions 75 of the storage node contact plugs 80 extend in the Y-axis direction.

Since the storage node electrodes 90 are diagonally arranged, additional space exists between the storage node electrodes that are adjacent in the X-axis and Y-axis directions. Thus, the storage node electrodes 90 can be further increased in size.

The present embodiment is not limited to FIGS. 4 and 5. That is, in FIG. 4, the storage node contact plugs 80 are formed in a matrix shape and the storage node electrodes 90 are formed in a diagonally aligned pattern. However, as shown in FIG. 8H, it is also possible for the storage node contact plugs 180 to contact the second contacts 175 and be arranged in a diagonal pattern. Likewise, the diameter of the entrance portions of the storage node contact plugs 180 can be larger than that of the contacting portions.

FIGS. 6A through 6E and 7A through 7E are cross-sectional diagrams of a DRAM memory cell according to another embodiment of the invention. FIGS. 6A through 6E are cross-sectional diagrams taken in a direction parallel to word line structures, and FIGS. 7A through 7E are cross-sectional diagrams taken in a direction parallel to bit line structures. FIGS. 8A through 8G are plan diagrams of a DRAM memory cell according to another embodiment of the invention.

Figure 6A:
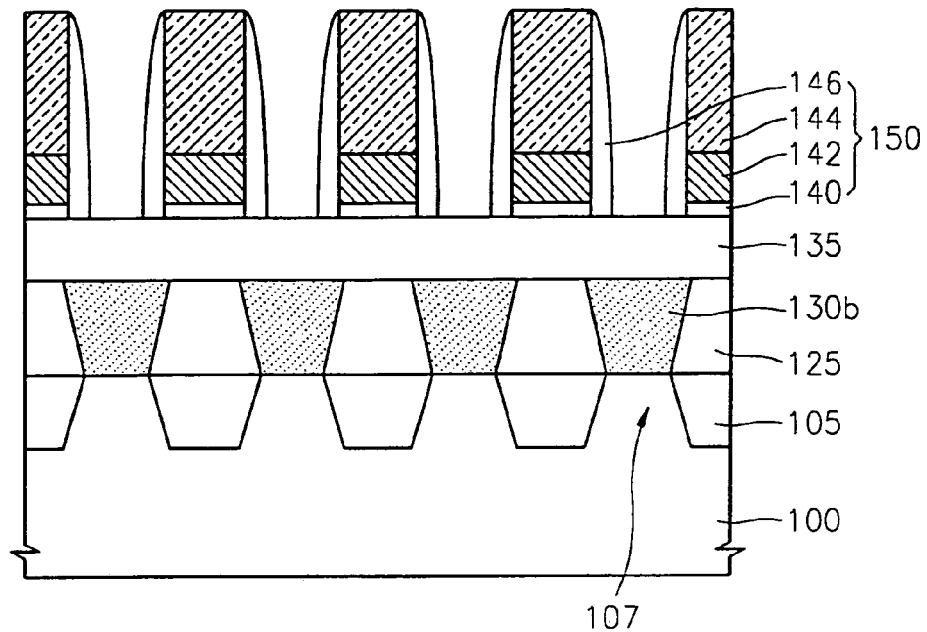
FIGS. 6A through 6E are cross-sectional diagrams illustrating a DRAM memory cell according to another embodiment of the invention, taken in a direction parallel to word line structures.
Figure 7A:
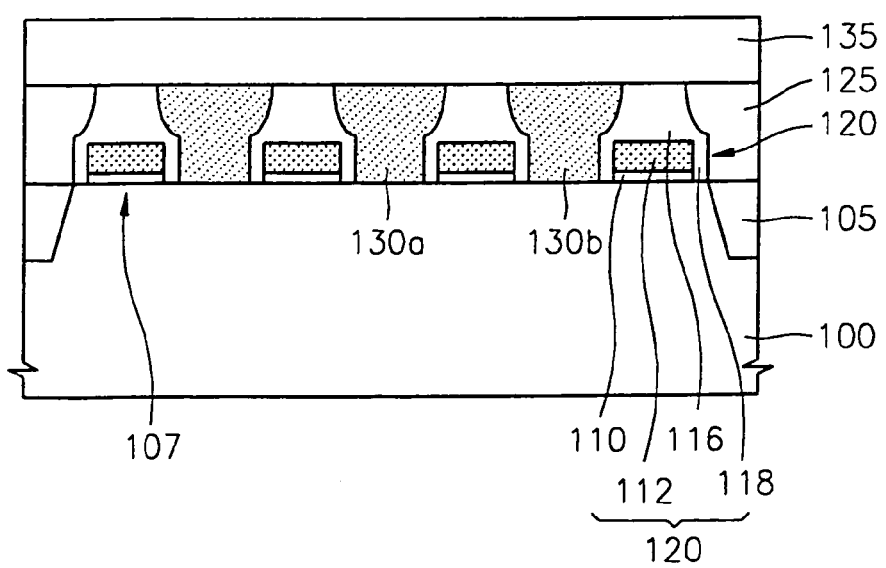
FIGS. 7A through 7E are cross-sectional diagrams illustrating a DRAM memory cell according to another embodiment of the invention, taken in a direction parallel to bit line structures.
Figure 8A:
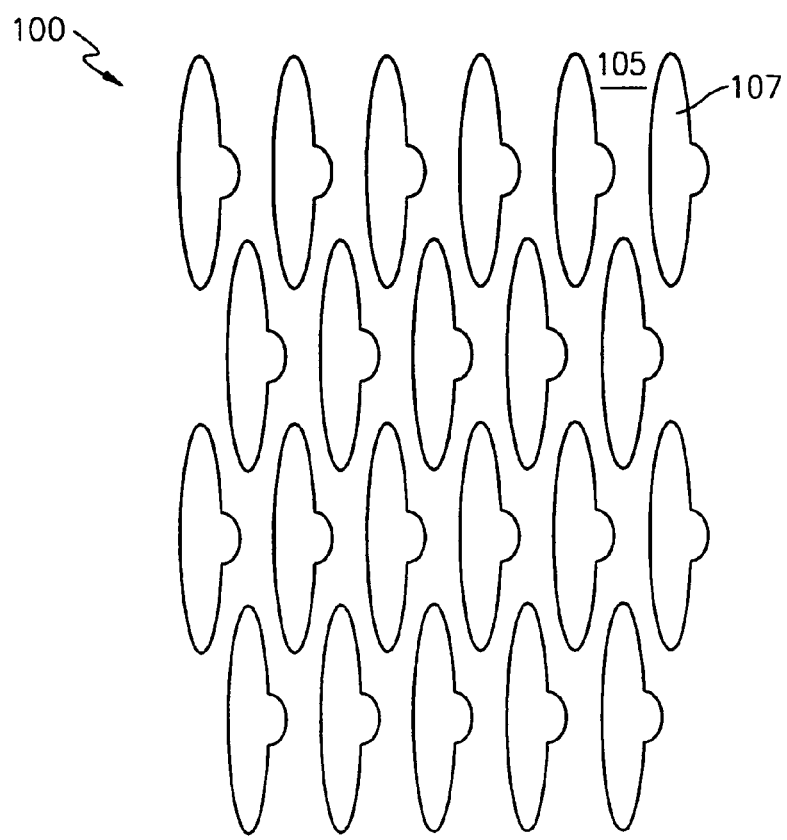
FIGS. 8A through 8G are plan diagrams illustrating a DRAM memory cell according to another embodiment of the invention.
Figure 8B:
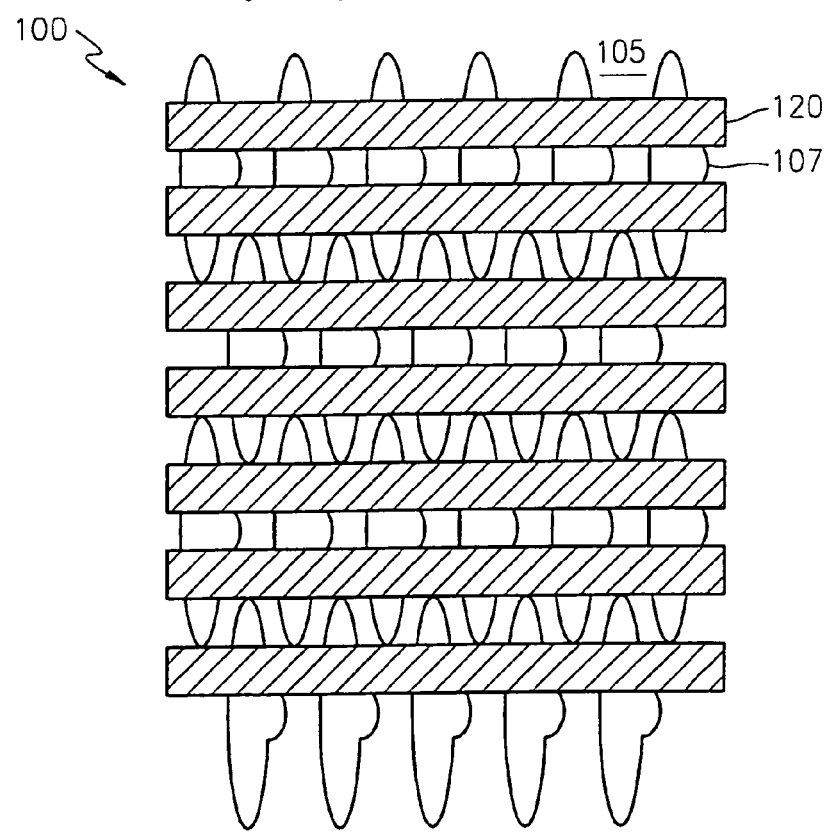
Figure 8C:
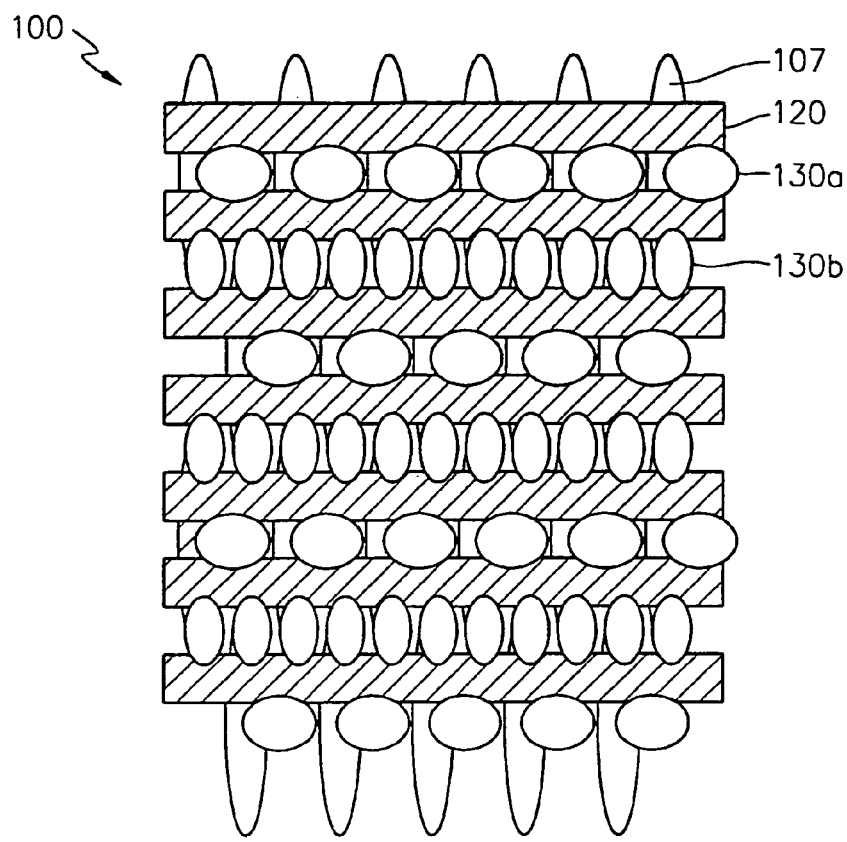

To begin, referring to FIGS. 6A, 7A, and 8A, an isolation layer 105 is formed using shallow trench isolation (STI) on a predetermined portion of a semiconductor substrate 100, thereby defining active regions 107. Like the active regions of FIG. 1A, the active regions 107 are in a rough T shape rotated by 90°. To dispose the greatest number of active regions 107 on the semiconductor substrate 100 within a limited area, parallel columns of the active regions 107 are formed on the semiconductor substrate 100 and every column of active regions 107 is disposed such that some portions of the active regions 107 are found in a gap between the active regions 107 of an adjacent column. Thereafter, a gate insulating layer 110, a doped polysilicon layer 112, a transition metal layer (or a transition metal silicide layer: not shown), and a hard mask layer 116 are sequentially stacked on the semiconductor substrate 100 and then patterned in the shape of word lines. Next, word line spacers 118 are formed using a conventional method on the sidewalls of the patterned hard mask layer 116, transition metal layer (or transition metal silicide layer: not shown), doped polysilicon layer 112, thereby completing word line structures 120 (see FIG. 8B). Here, the word line spacers 118 may be formed of the same material as the hard mask layer 116, for example, silicon nitride. As described above, a pair of word line structures 120 are formed to cross over one row of active regions 107. Impurity ions are implanted into the active regions 107 on both sides of the word line structures 120 to form sources and drains (not shown). Thus, a transistor is completed.

A first ILD 125 is deposited on the resultant structure of the semiconductor substrate 100 where the transistor is formed. The first ILD 125 may be formed of, for example, silicon oxide. Next, the first ILD 125 is etched until the sources and drains are exposed, thereby forming contact holes (not shown). The contact holes (not shown) may be formed in a self-aligned manner by means of the word line structures 120. While the contact holes are being formed, upper portions of the word line structures 120 may be partially removed due to an etchant. However, since the hard mask layer 116 is formed to a relatively thick thickness, the conductive layers 112 and 114 are not exposed. A conductive layer, for example, a doped polysilicon layer, is deposited on the first ILD 125 to fill the contact holes and is then polished using chemical mechanical polishing (CMP). Thus, first contact pads 130a and second contact pads 130b are formed (see FIG. 8C). As described above, the first contact pads 130a are electrically connected to the drains, and the second contact pads 130b are electrically connected to the sources. A second ILD 135 is deposited on the resultant structure where the first and second contact pads 130a and 130b are formed. To avoid obscuring details of the invention, the ILDs 125 and 135 are not shown in the plan diagrams.

Figure 8D:
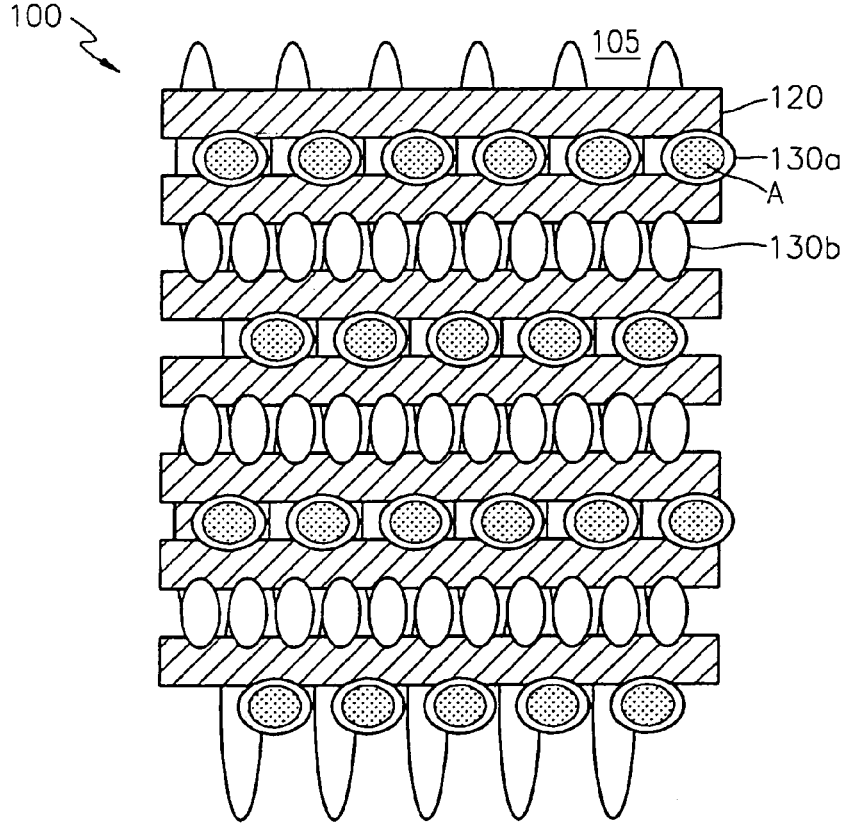
Figure 8E:
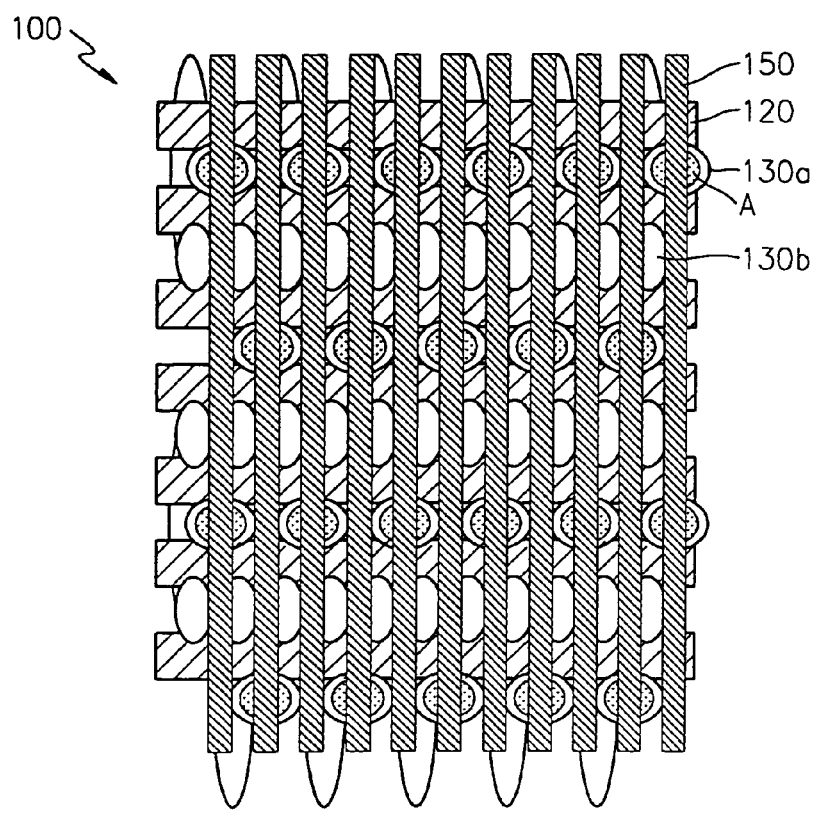

Thereafter, as shown in FIG. 8D, the second ILD 135 is etched until the first contact pads 130a are exposed, thereby forming bit line contact holes (not shown). In FIG. 8D, reference character "A" refers to the surface of the first contact pad 130a, which is exposed by the bit line contact hole. As shown in FIG. 6A, a barrier metal layer 140, a conductive layer 142 for bit lines, and a hard mask layer 144 are sequentially stacked on the second ILD 135. The barrier metal layer 140 may be one of a titanium layer and a titanium nitride layer, and the conductive layer 142 for the bit lines may be a tungsten metal layer. The hard mask layer 144, the conductive layer 142 for the bit lines, and the barrier metal layer 140 are patterned to contact the first contact pads 130a and to be perpendicular to the word line structures 120 (FIG. 7A). Afterwards, bit line spacers 146 are formed using the same material as the hard mask layer 144 on the sidewalls of the patterned structure, thereby forming bit line structures 150 (see FIG. 8E and FIG. 6A). The bit line spacers 146 are formed of the same material as the hard mask layer 144.

Figure 6B:
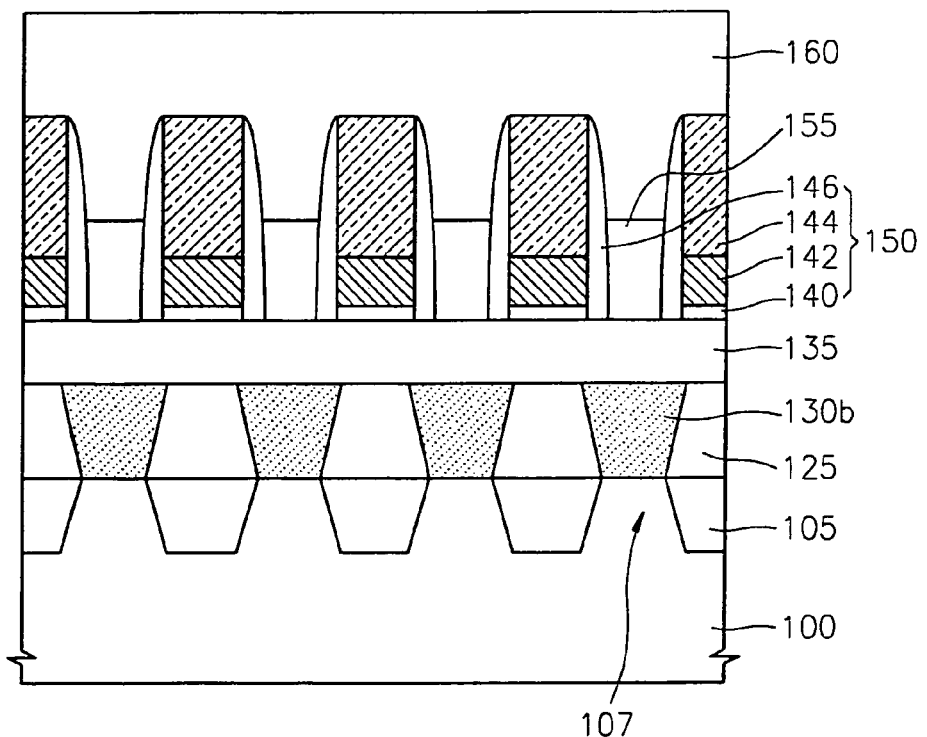
Figure 6C:
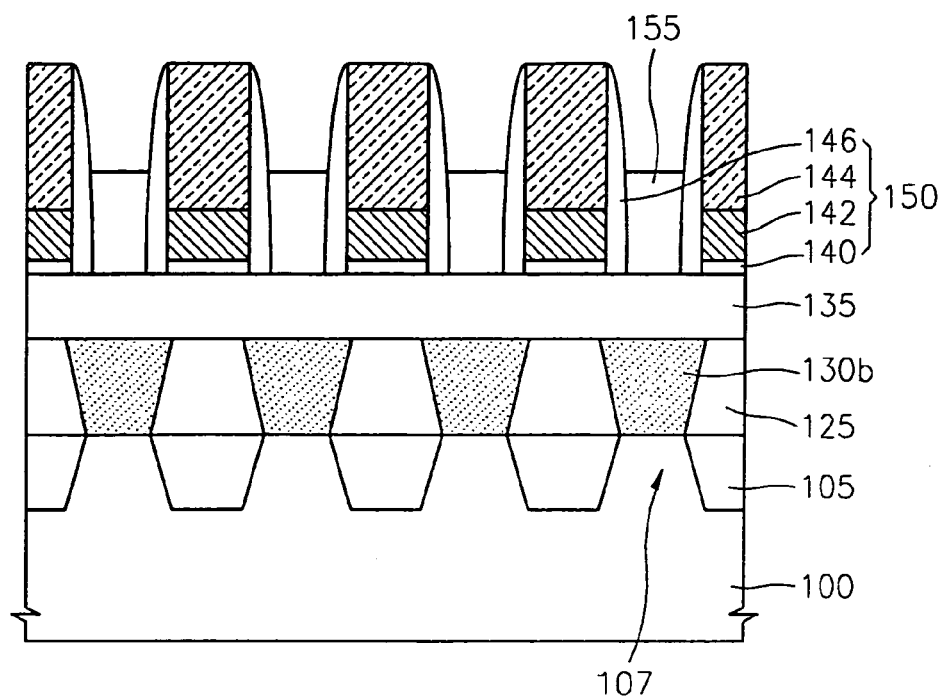
Figure 7B:
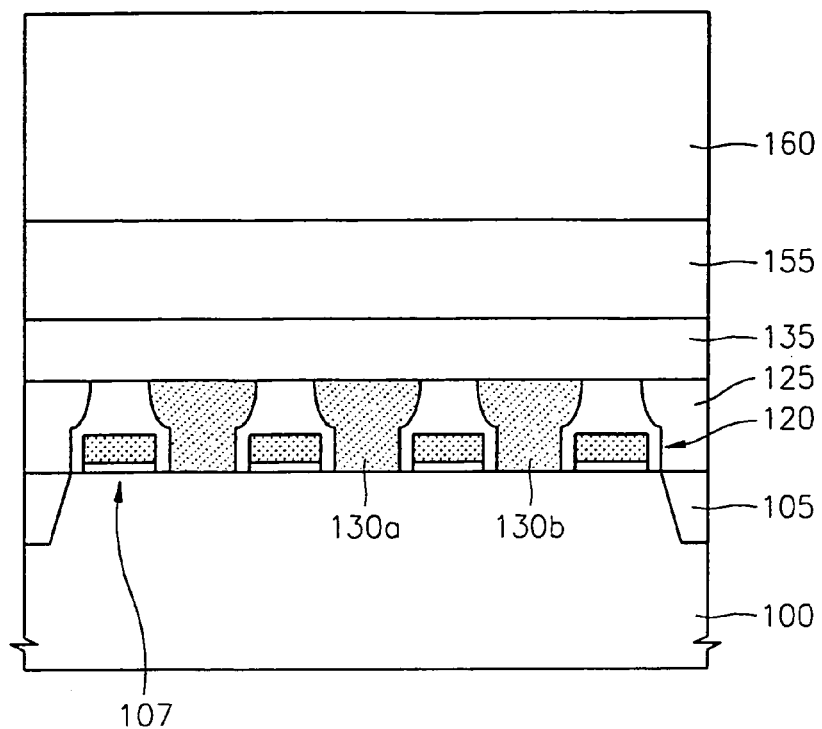

Thereafter, as shown in FIGS. 6B and 7B, a third ILD 155 is deposited on the second ILD 135 where the bit line structures 150 are formed. The third ILD 155 is formed to a thickness that is less than the height of the bit line structures 150, i.e., the third ILD 155 is deposited to partially fill the gaps between the bit line structures 150. Here, the third ILD 155 is preferably deposited to be thicker than the conductive layer 142 for the bit lines. A fourth ILD 160 is deposited on the third ILD 155. The fourth ILD 160 is formed of a material with an etch rate higher than that of the third ILD 155. The second and third ILDs 135 and 155 may be formed of silicon oxide like the first ILD 125, and the fourth ILD 160 may be a BPSG layer or a USG layer. The fourth ILD 160 is deposited to sufficiently fill the gaps between the bit line structures 150. Then, the surface of the fourth ILD 160 is planarized.

Figure 7C:
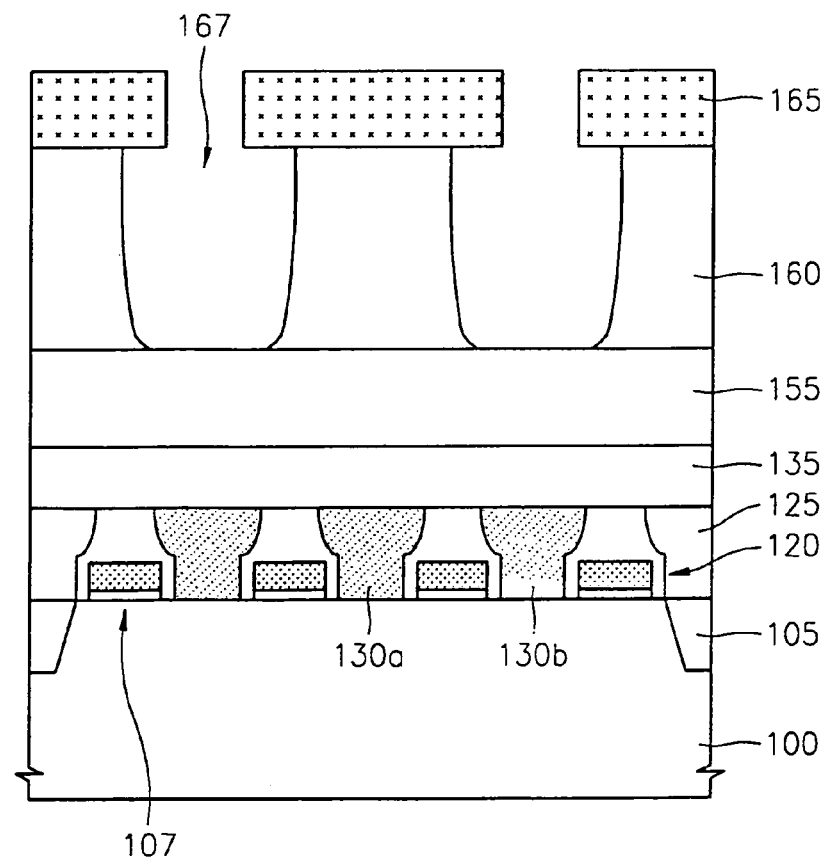
Figure 8F:
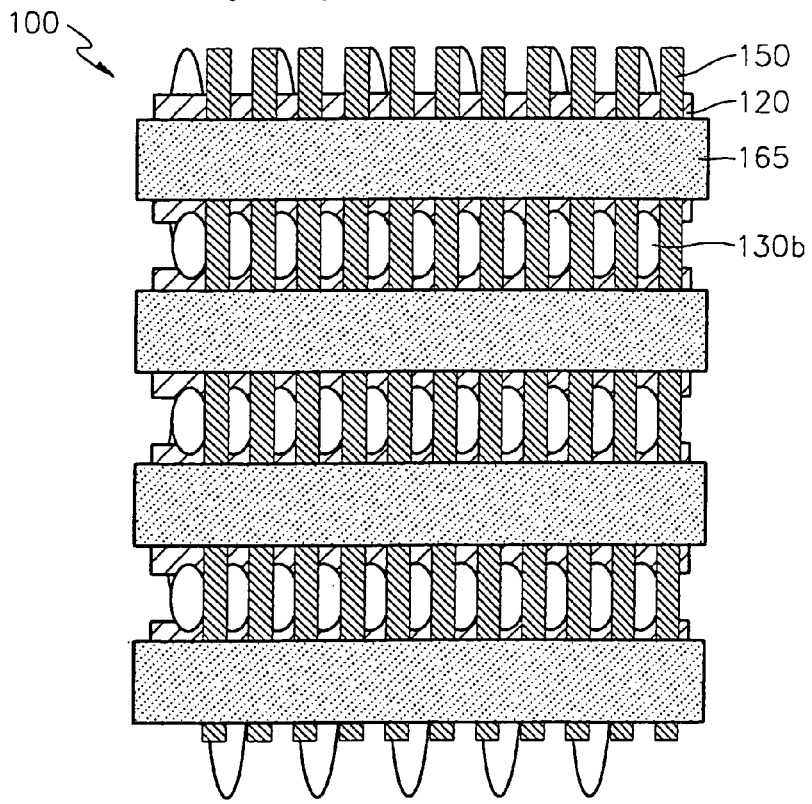

Thereafter, as shown in FIGS. 7C and 8F, a photoresist pattern 165 is formed so as to expose the second contact pads 130b. The photoresist pattern 165 is formed to be parallel to the word line structures 120, cover the first contact pads 130a, and partially overlap the word line structures 120. By using the photoresist pattern 165 as an etch mask, the fourth ILD 160 is anisotropically etched to a predetermined thickness using a dry etch process and secondarily etched using a wet etch process. As a result, the fourth ILD 160 that is exposed by the photoresist pattern 165 is wholly removed, while the fourth ILD 160 that is disposed under the photoresist pattern 165 is isotropically removed such that a distance between the fourth ILDs 160 is greater than that between the photoresist patterns 165. Thus, the entrance portions 167 of storage node contact holes are defined. Here, an etchant used for removing the fourth ILD 160 may be an HF solution that is diluted with water in the ratio of, for example, 1:100.

Figure 6D:
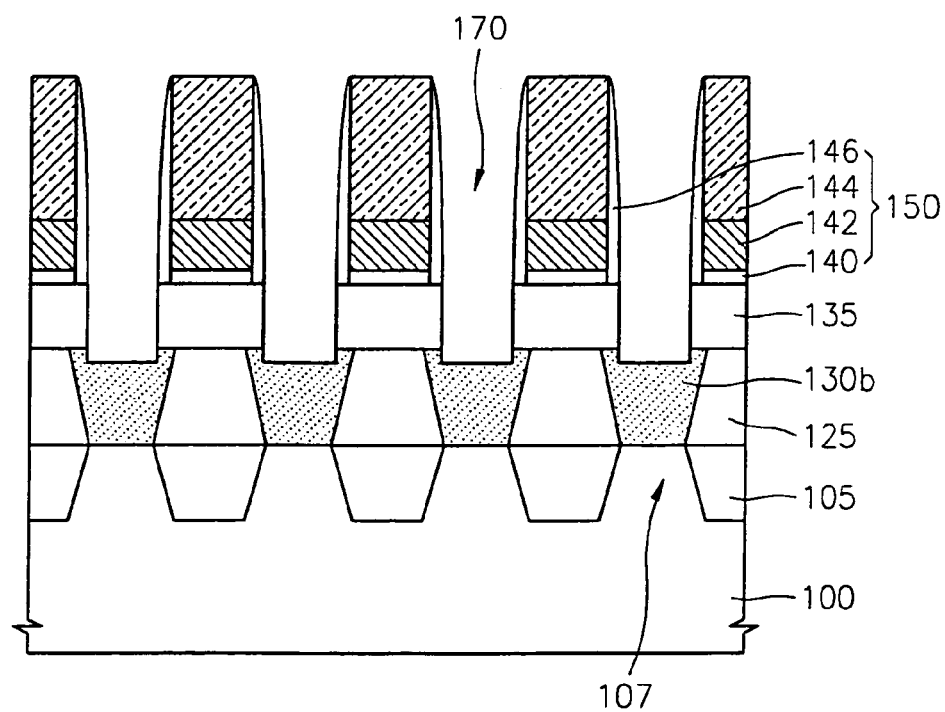
Figure 7D:
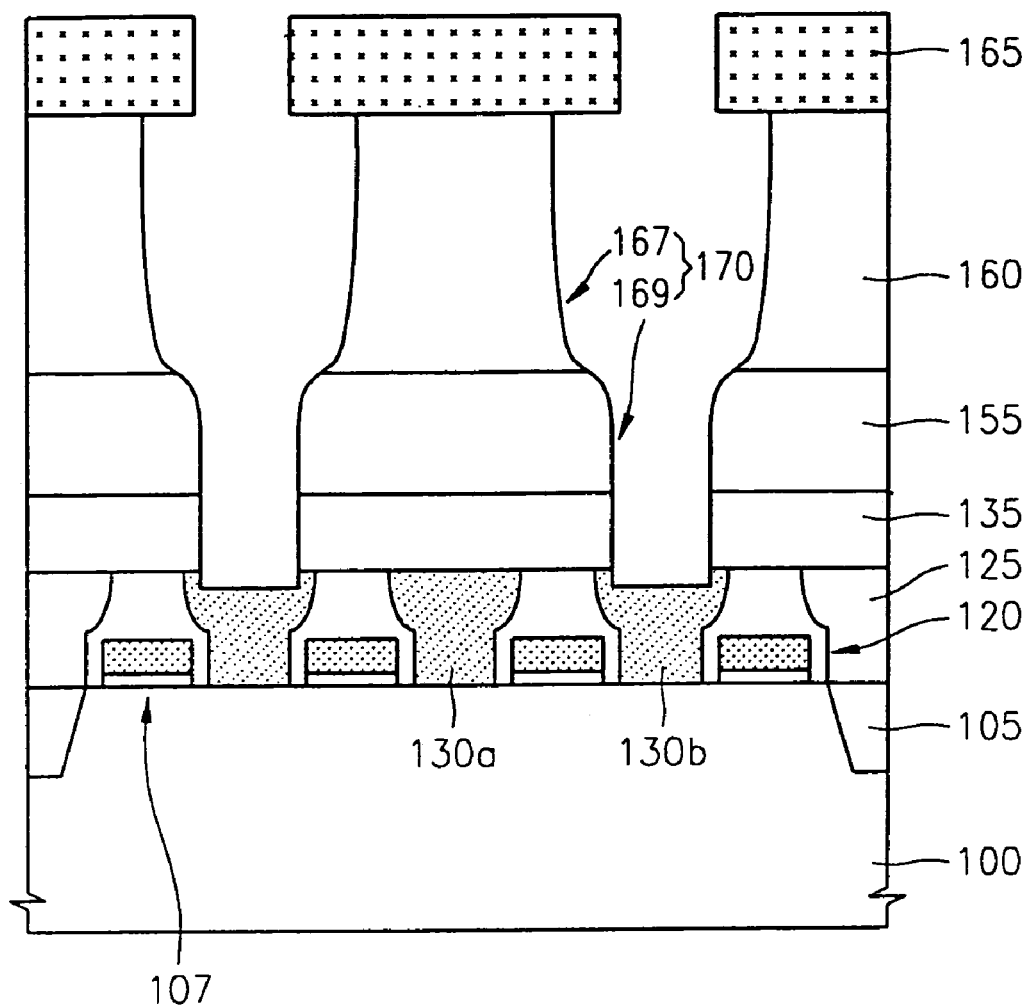

Next, as shown in FIGS. 7D and 6D, the third ILD 155 and the second ILD 135 are anisotropically etched using the photoresist pattern 165 as an etch mask so as to define contacting portions 169, thereby completing storage node contact holes 170. Here, in a direction parallel to the word line structures 120 (FIG. 6D), the storage node contact holes 170 are formed in a self-aligned manner by means of the bit line structures 150. Meanwhile, in a direction parallel to the bit line structures 150 (FIG. 7D), the storage node contact holes 170 are formed such that the linewidth of the entrance portions 167 is greater than that of the contacting portions 169.

Figure 6E:
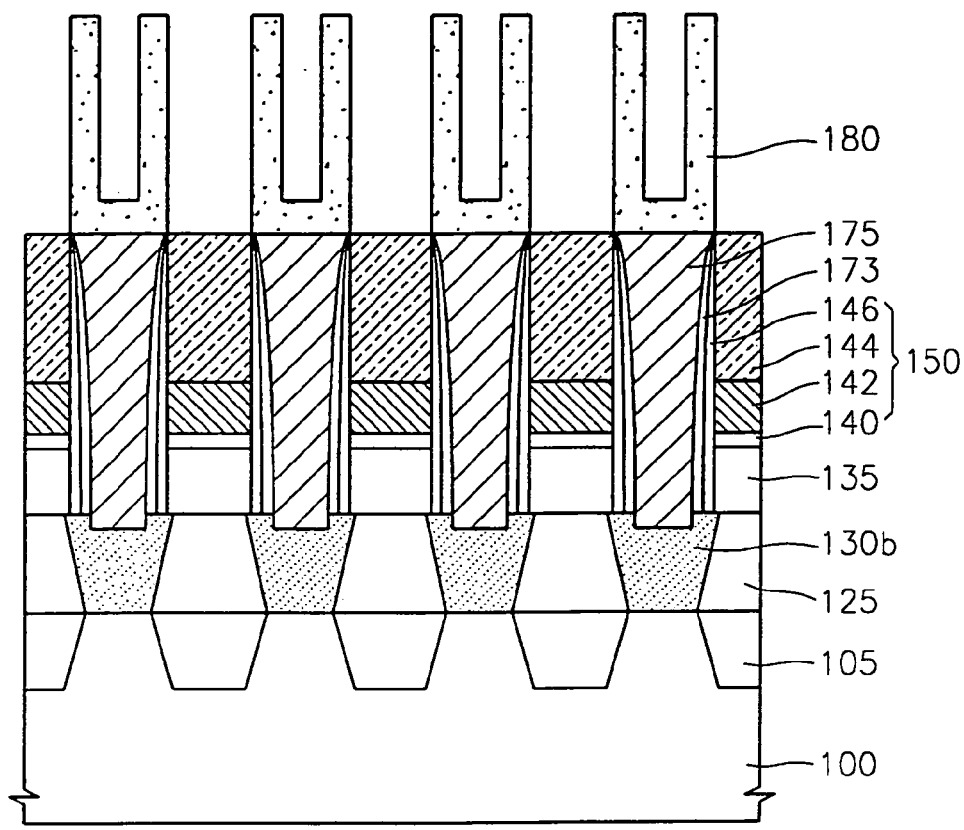
Figure 7E:
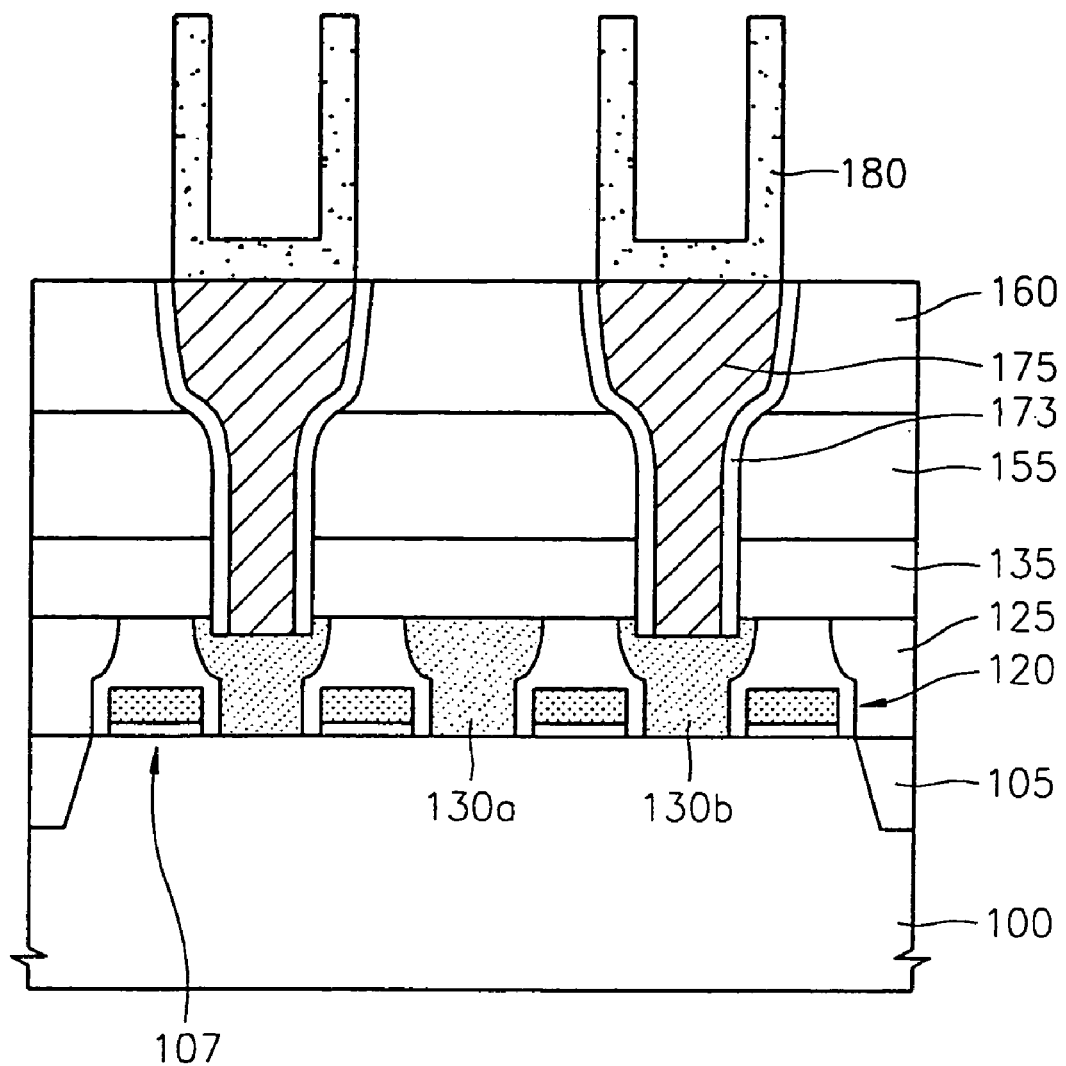
Figure 8G:
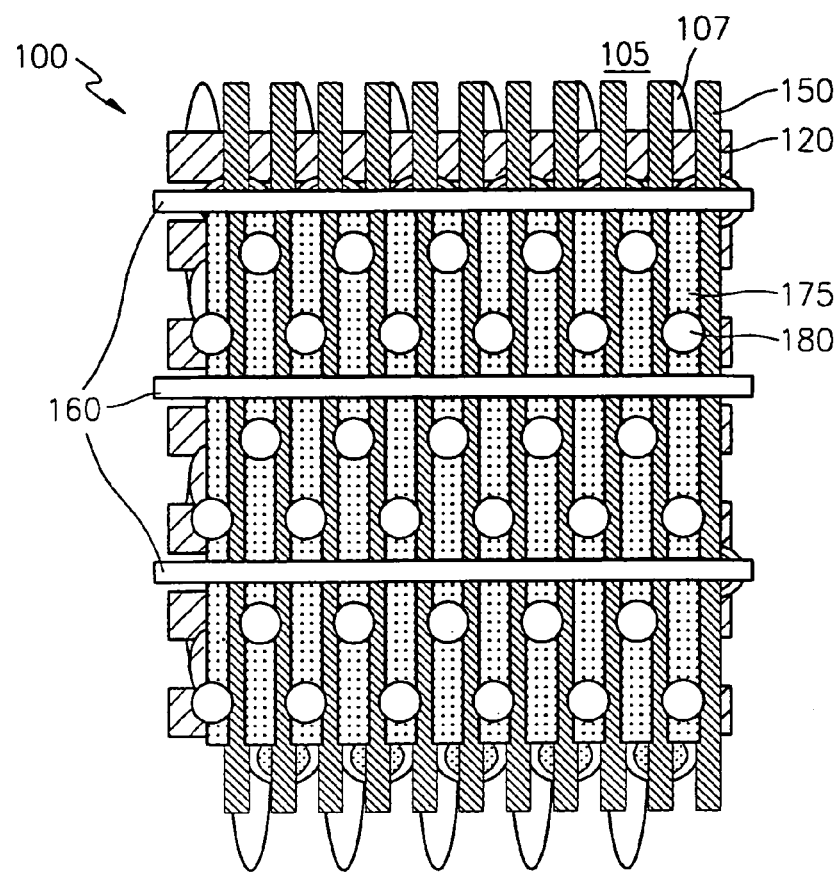
Figure 8H:
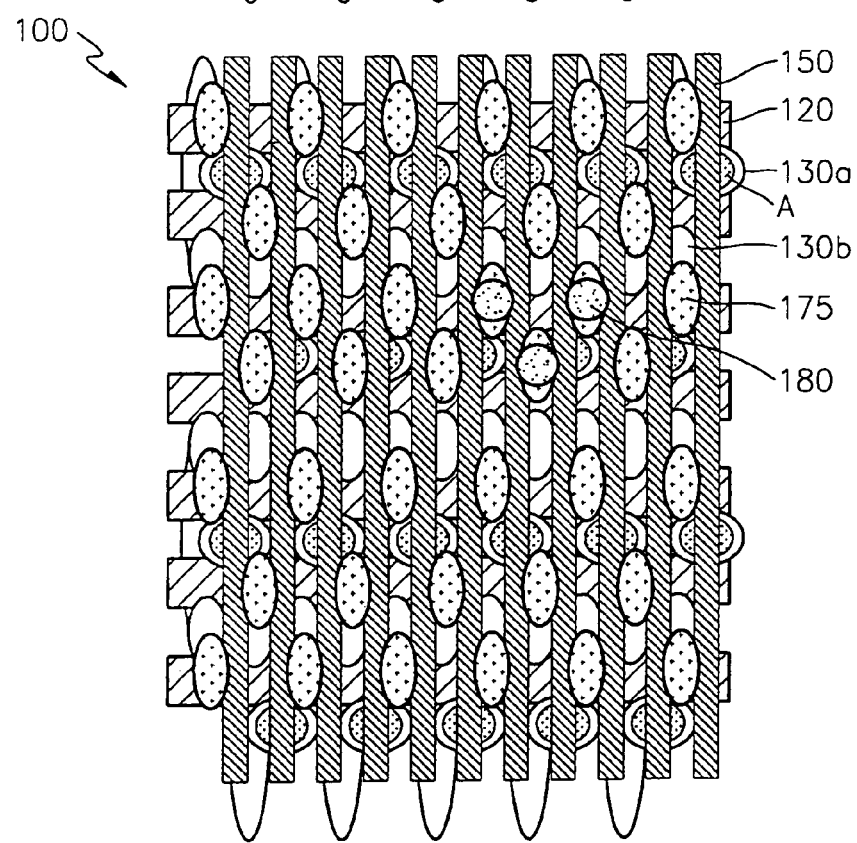
FIG. 8H is a plan diagram of a transformed example DRAM memory cell according to the present invention.

As shown in FIGS. 6E and 7E, the photoresist pattern 165 is removed by a conventional method. Then, a thin insulating layer is deposited on the resultant structure, from which the photoresist pattern 165 is removed, and anisotropically etched using a blanket method. Thus, contact spacers 173 are formed on the sidewalls of the storage node contact holes 170 and the sidewalls of the bit line structures 150. The contact spacers 173 are used to electrically isolate storage node contact plugs from the conductive layer 142 that will form the bit lines. Afterwards, a conductive layer, for example, a doped polysilicon layer, is deposited to sufficiently fill the storage node contact holes 170. The conductive layer is then polished using CMP until the surfaces of the bit line structures 150 are exposed, thereby forming storage node contact plugs 175. Here, in a direction parallel to the bit lines (FIG. 7E), the storage node contact plugs 175 are formed such that their entrance portions are larger than their contacting portions. Then, storage node contact electrodes 180 are formed to contact the storage node contact plugs 175. As shown in FIG. 8G, the storage node electrodes 180 that occupy the same row are disposed in a zigzag, or diagonal, pattern. Thus, a margin between the adjacent storage node electrodes 180 can be secured in both the X-axis and Y-axis directions.

Figure 9A:
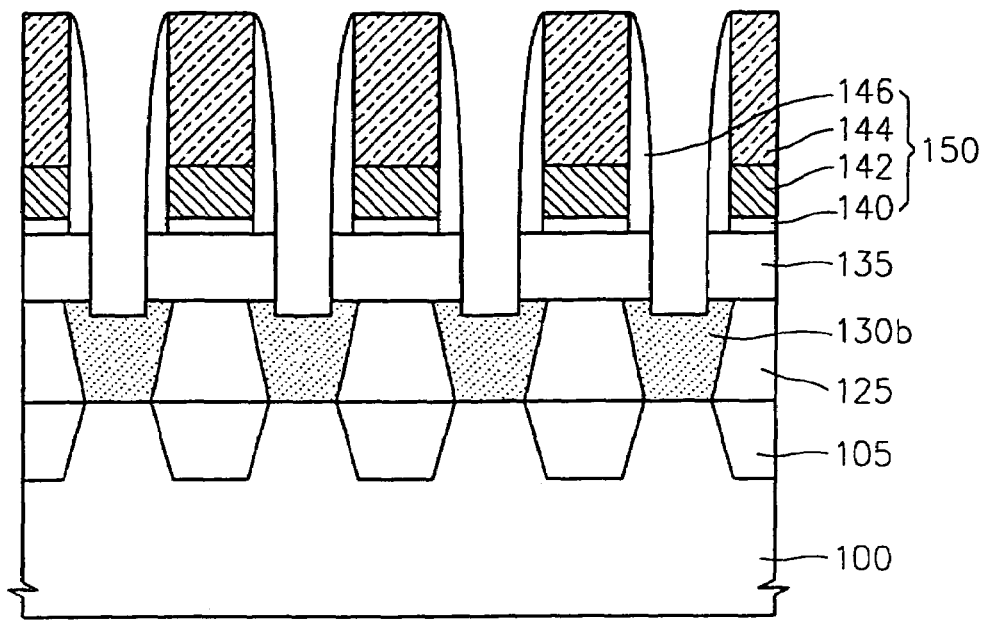
FIGS. 9A through 9C are cross-sectional diagrams illustrating yet another embodiment of the invention, taken in a direction parallel to word line structures.
Figure 9B:
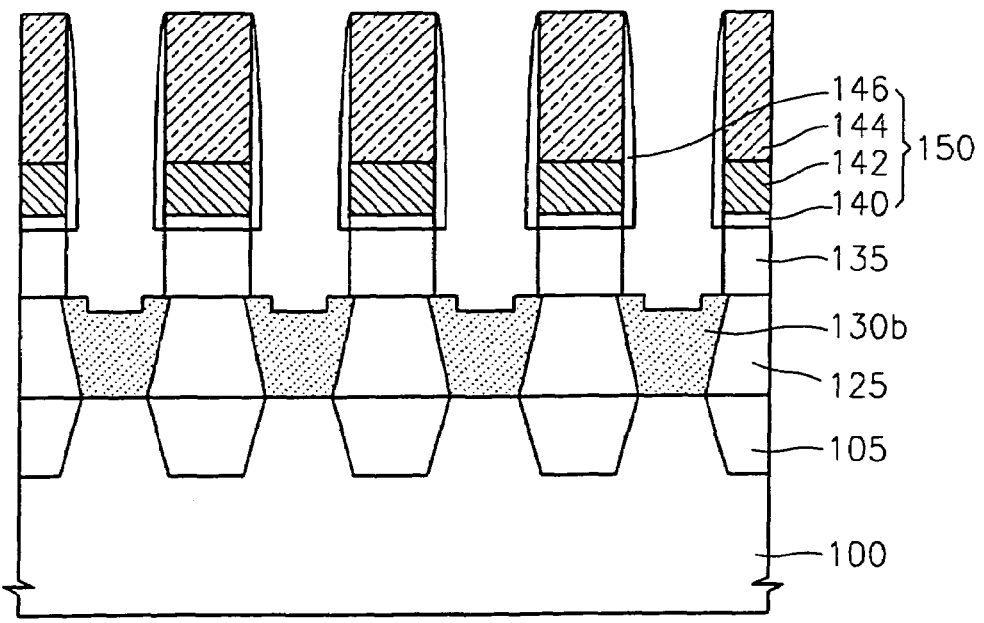
Figure 9C:
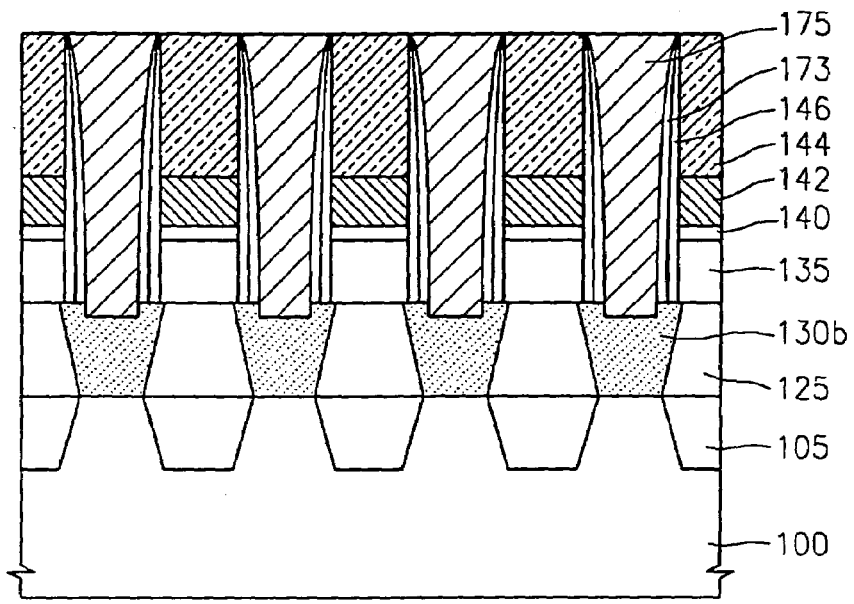
Figure 10A:
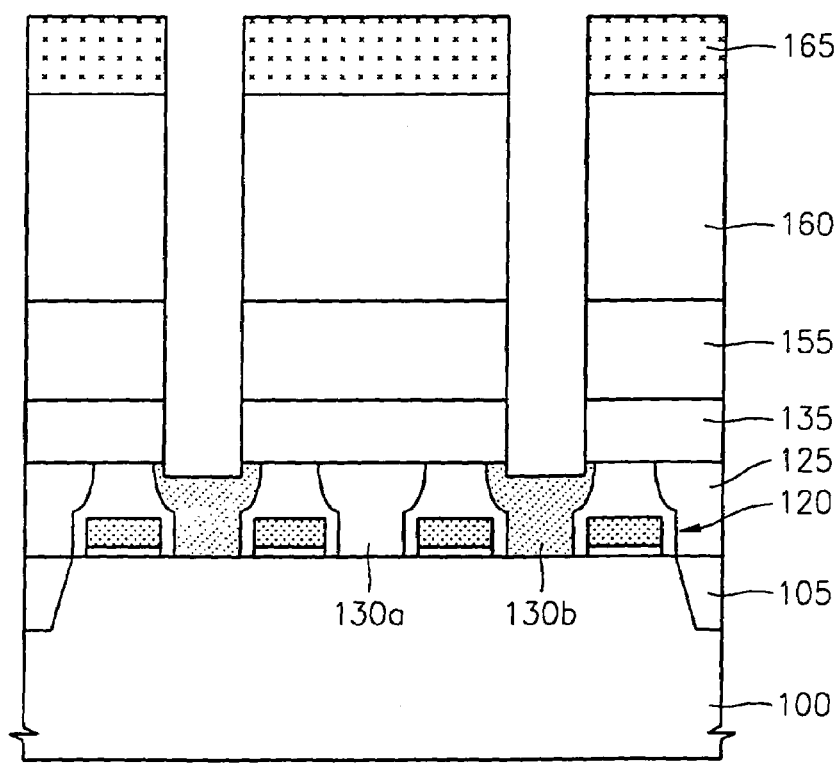
FIGS. 10A through 10C are cross-sectional diagrams illustrating yet another embodiment of the invention, taken in a direction parallel to bit line structures.
Figure 10B:
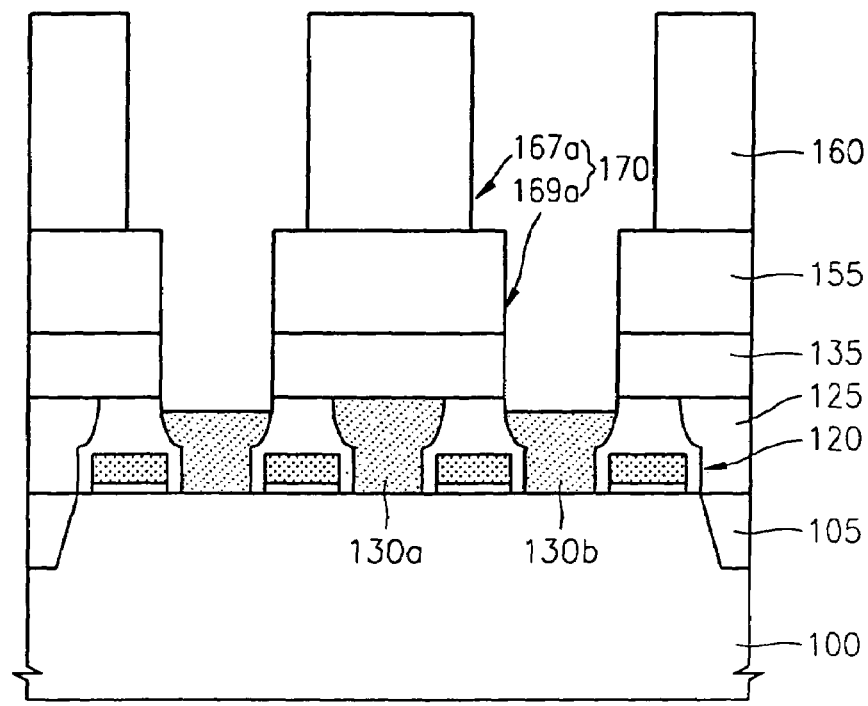
Figure 10C:
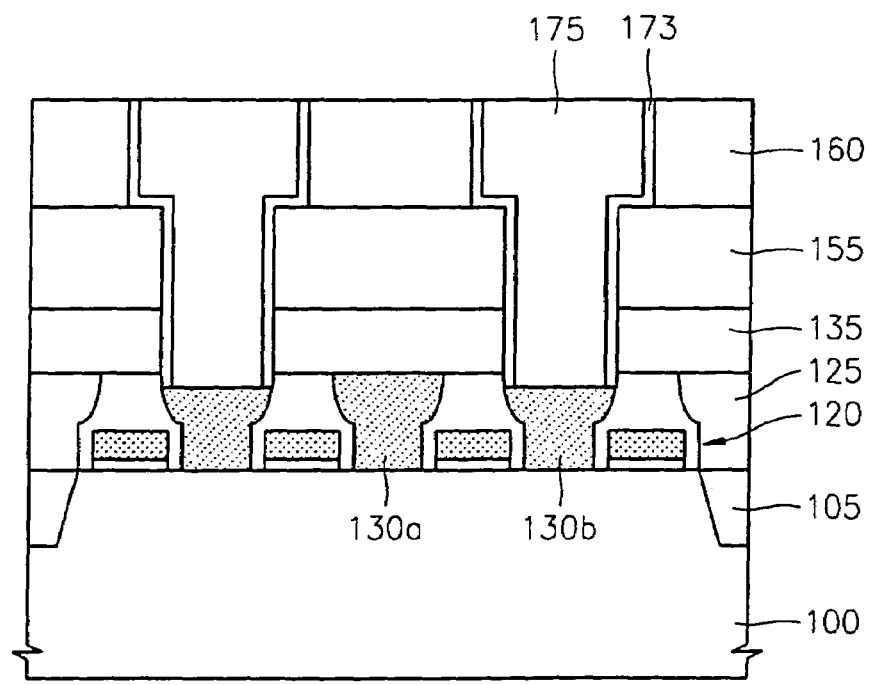

FIGS. 9A through 9C and 10A through 10C are cross-sectional diagrams illustrating a method of manufacturing storage node contact plugs of a DRAM memory cell according to yet another embodiment of the invention. Here, FIGS. 9A through 9C are cross-sectional diagrams taken in a direction parallel to word line structures, and FIGS. 10A through 10C are cross-sectional diagrams taken in a direction parallel to bit line structures. In this embodiment, since forming a device isolation region 105 and forming a photoresist pattern 165 are performed in substantially the same manner as in the embodiment described in FIGS. 6, 7, and 8, the detailed description will be omitted here.

As shown in FIGS. 9A and 10A, a fourth ILD 160, a third ILD 155, and a second ILD 135 are etched using a photoresist pattern 165 as an etch mask to expose second contact pads 130b. The fourth ILD 160 is formed using a material with an etch rate that is higher than that of the third ILD 155 and the second ILD 135.

Thereafter, as shown in FIGS. 9B and 10B, the photoresist pattern 165 is removed by a conventional method, and then the exposed fourth ILD 160, the third ILD 155, and the second ILD 135 are wet etched using an HF solution. Since the etch rate of the fourth ILD 160 is higher than that of the third ILD 155 and the second ILD 135, the ILDs 160, 155, and 135 are etched in the shape of a Y as shown in FIG. 10B. The etching time for the wet etch process is calculated to etch the third ILD 155 and the second ILD 135 by about several to several tens of Å. This additional wet etch process results in the formation of storage node contact holes 170a, which include wide entrance portions 167a and narrow contacting portions 169a. During the additional wet etch process, bit line spacers 146 and a hard mask layer 144, which together constitute bit line structures 150, may be partially removed, thus exposing a portion of a conductive layer 142 for bit lines.

Thereafter, as shown in FIGS. 9C and 10C, an insulating layer is deposited on the resultant structure where the storage node contact holes 170a are formed and anisotropically etched using a blanket method. Thus, contact spacers 173 are formed on the sidewalls of the bit line structures 150 and the sidewalls of the storage node contact holes 170a. As described above, the contact spacers 173 electrically isolate the bit line contact layers 142, which may be exposed during etching, from storage node contact plugs that will be formed later. Next, a conductive layer, for example, a doped polysilicon layer, is deposited to fill the storage node contact holes 170a. The conductive layer is then polished using CMP until the surface of the hard mask layer 144 is exposed. Thus, storage node contact plugs 175 are formed. The storage node contact plugs 175 have a Y shape by virtue of the Y-shaped storage node contact holes 170a.

Thereafter, although not shown in the drawings, storage node electrodes are disposed in the same manner as that shown for FIGS. 6, 7, and 8.

FIGS. 11A through 11G and 12A through 12G are cross-sectional diagrams illustrating a method of manufacturing storage node contact plugs of a DRAM memory cell according to still another embodiment of the invention. Here, FIGS. 11A through 11G are cross-sectional diagrams taken in a direction parallel to word line structures, and FIGS. 12A through 12G are cross-sectional diagrams taken in a direction parallel to bit line structures. In this embodiment, since forming a device isolation region 105 and forming a second ILD 135 are performed in the same manner as that shown for the embodiment illustrated in FIGS. 6, 7, and 8, the detailed description will be omitted here.

Figure 11A:
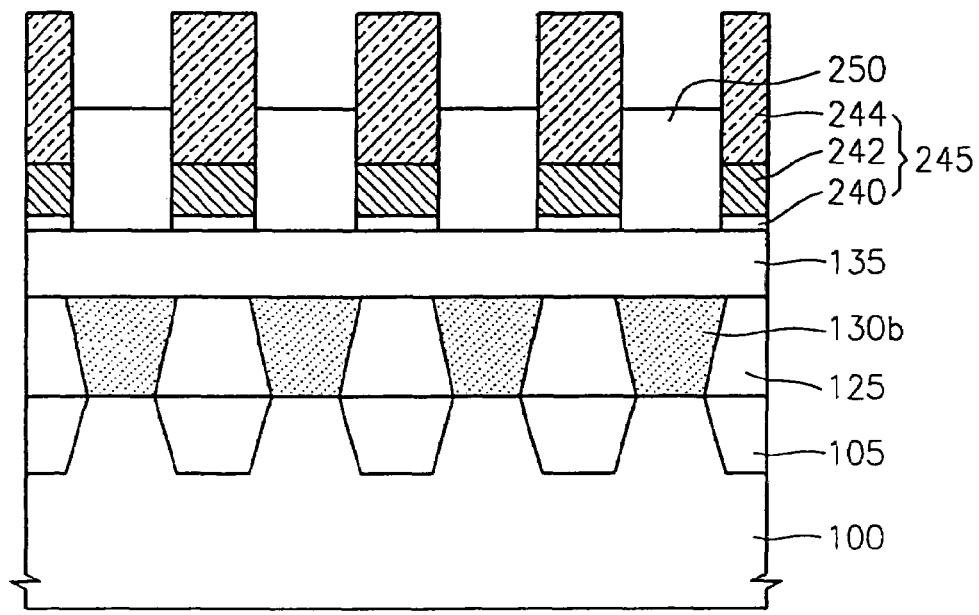
FIGS. 11A through 11G are cross-sectional diagrams illustrating yet another embodiment of the invention, taken in a direction parallel to word line structures.
Figure 12A:
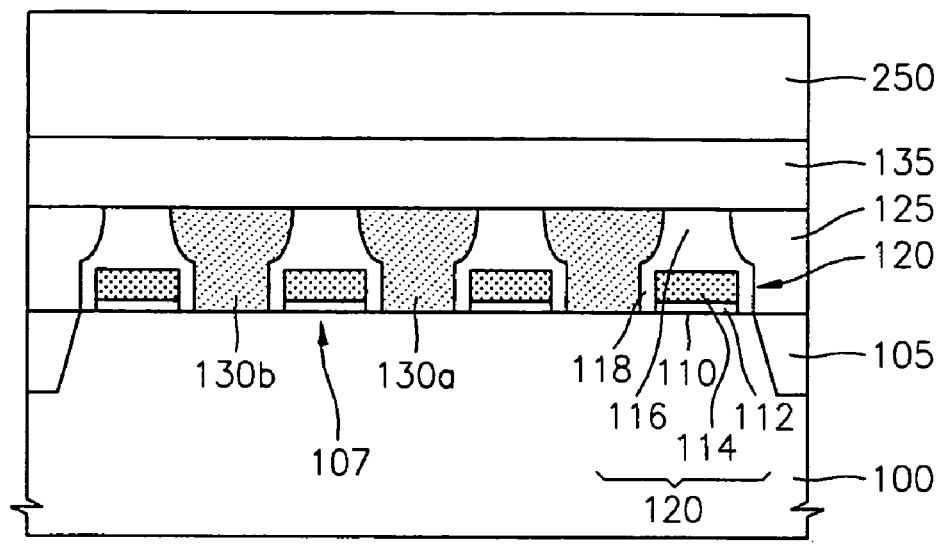
FIGS. 12A through 12G are cross-sectional diagrams illustrating still another embodiment of the invention, taken in a direction parallel to bit line structures.

Referring to FIGS. 11A and 12A, a barrier metal layer 240, a conductive layer 242 for bit lines, and a hard mask layer 244 are sequentially stacked on the resultant structure where the second ILD 135 is formed. The barrier metal layer 240 and the hard mask layer 244 may be formed of the same materials as in the embodiment illustrated in FIGS. 4, 5, and 6. Next, the hard mask layer 244, the conductive layer 242 for the bit lines, and the barrier metal layer 240 are patterned to be perpendicular to the word line structures 120, thereby forming preliminary bit line structures 245. Afterwards, a third ILD 250 is formed on the second ILD 135 to a thickness that is less than that of the preliminary bit line structures 245. That is, the third ILD 250 is deposited to partially fill the gaps between the preliminary bit line structures 245. Preferably, the third ILD 250 is formed to be thicker than the conductive layer 242 for the bit lines. The second ILD 135 and the third ILD 250 may be formed of silicon oxide.

Figure 11B:
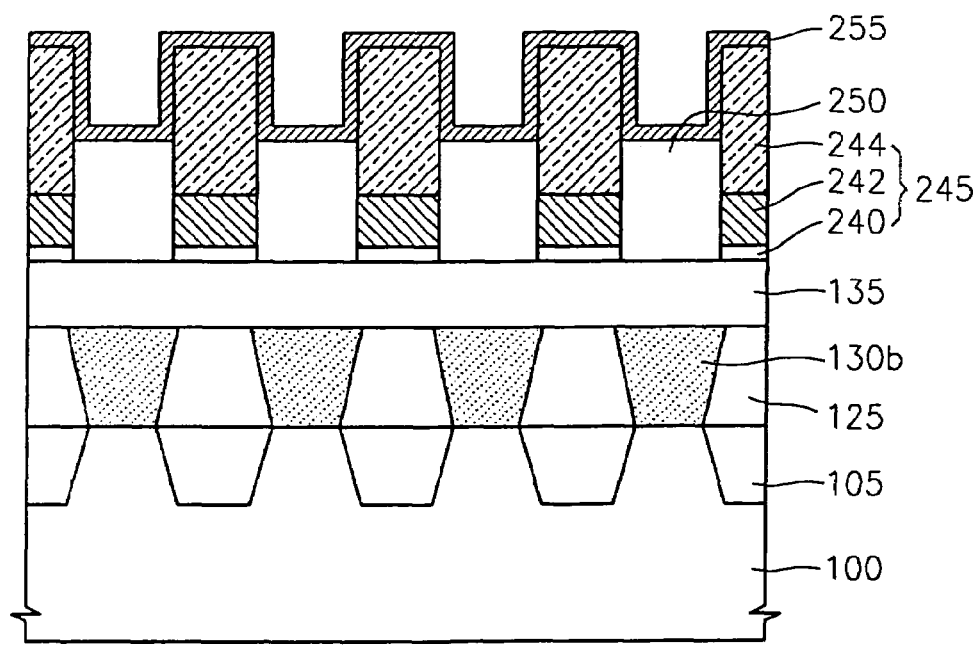
Figure 12B:
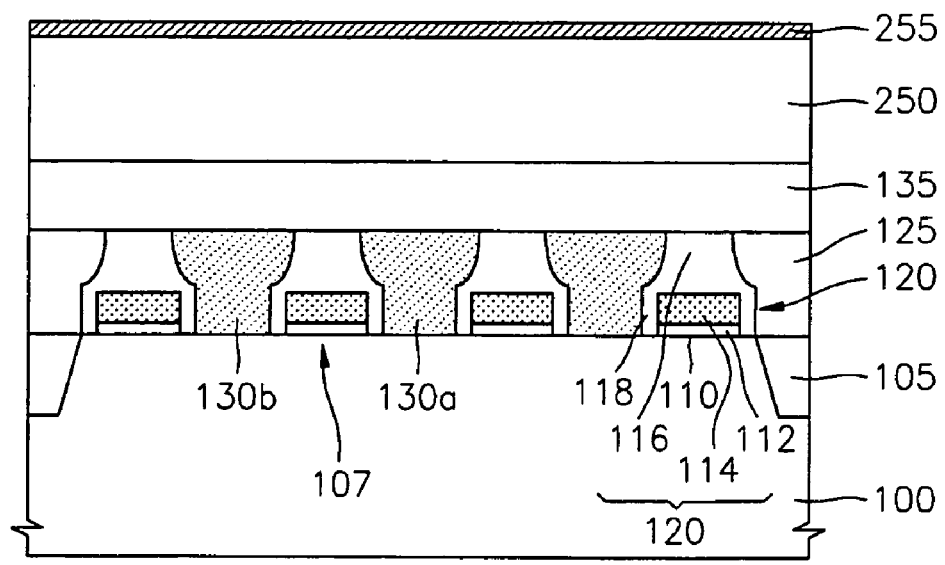

As shown in FIGS. 11B and 12B, an etch stopper 255 is formed on the third ILD 250 and the preliminary bit line structures 245. The etch stopper 255 may be formed of a layer, for example, a silicon nitride layer or a silicon oxynitride layer, with an etch selectivity different from that of the third ILD 250. Also, the etch stopper 255 is formed to a thickness of about 80 Å to 120 Å.

Figure 11C:
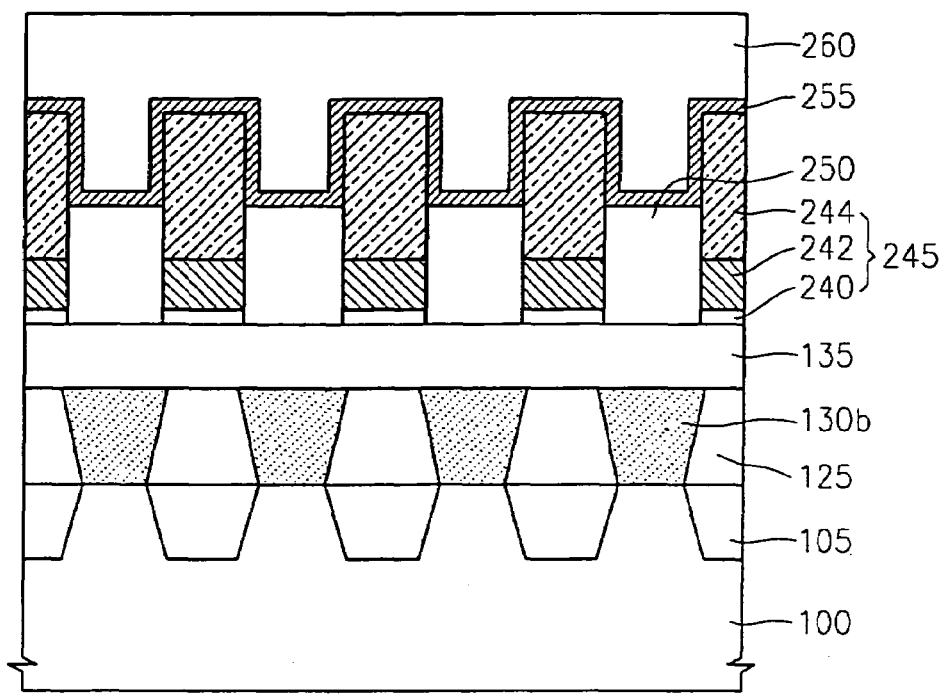
Figure 12C:
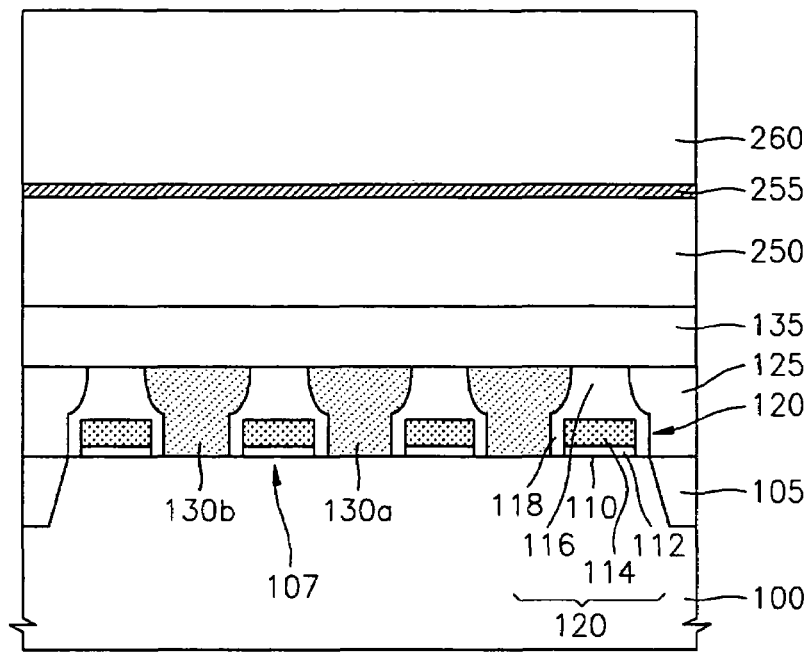

Also, as shown in FIGS. 11C and 12C, a fourth ILD 260 is deposited on the surface of the etch stopper 255. The fourth ILD 260 is deposited to sufficiently fill the gaps between the preliminary bit line structures 245 and may be formed of, for example, silicon oxide. Thereafter, the surface of the fourth ILD 260 is planarized.

Figure 11D:
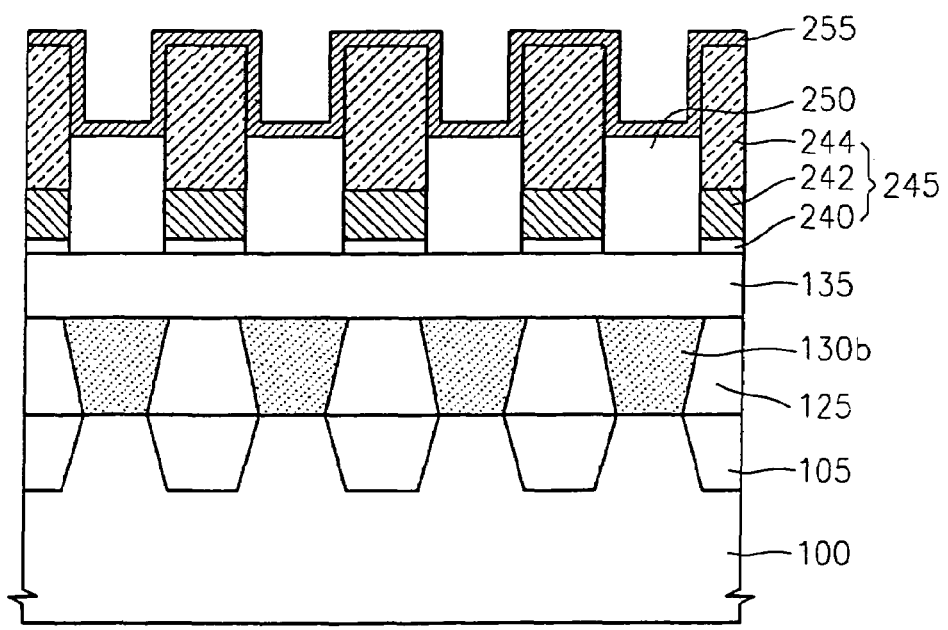
Figure 12D:
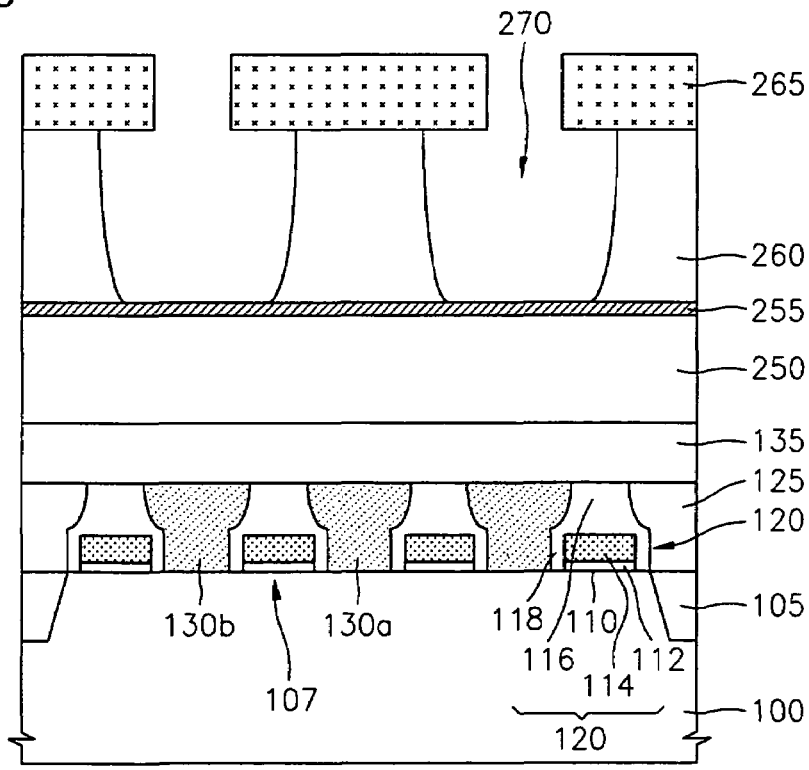

As shown in FIGS. 11D and 12D, a photoresist pattern 265 is formed on the fourth ILD 260 to expose second contact pads. Here, the photoresist pattern 265 may be disposed in the same manner as the embodiment illustrated in FIGS. 7 and 8. Then, the fourth ILD 260 is anisotropically etched using a dry etch process by a predetermined thickness in the shape of the photoresist pattern 265. The anisotropic dry etch process is carried out to leave a portion of the fourth ILD 260. Afterwards, the fourth ILD 260 is wet etched using the photoresist pattern 265 as an etch mask. Thus, entrance portions 270 of storage node contact holes are defined, and the sidewalls of the entrance portions 270 have an isotropic shape.

Figure 11E:
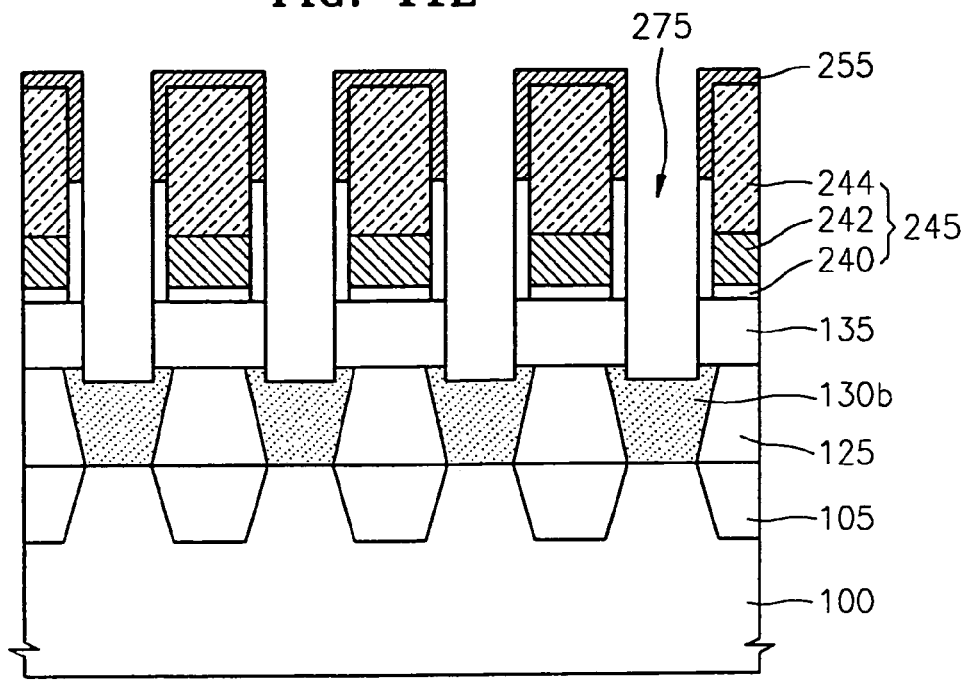
Figure 12E:
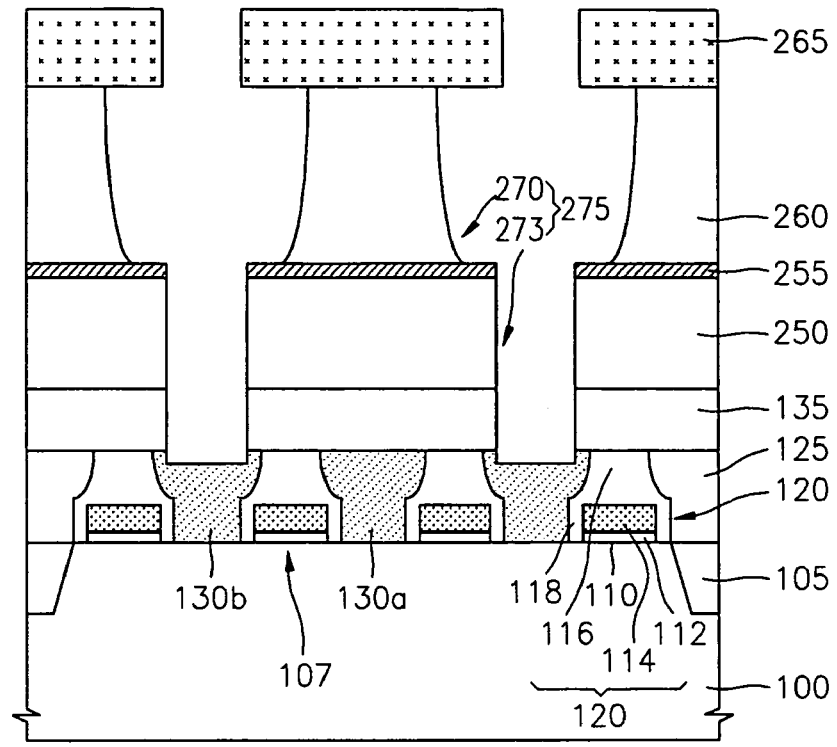

Thereafter, referring to FIGS. 11E and 12E, the etch stopper 255, the third ILD 250, and the second ILD 135 are anisotropically etched using a dry etch process in the shape of the photoresist pattern 265, thereby forming contacting portions 273, which expose the second contact pads 275. As a result, Y-shaped storage node contact holes 275 are defined. Afterwards, the photoresist pattern 265 is removed. Here, the photoresist pattern 265 may be removed after the etch stopper 255 is etched, and the third ILD 250 and the second ILD 135 may be etched using the patterned etch stopper 255 as an etch mask.

Figure 11F:
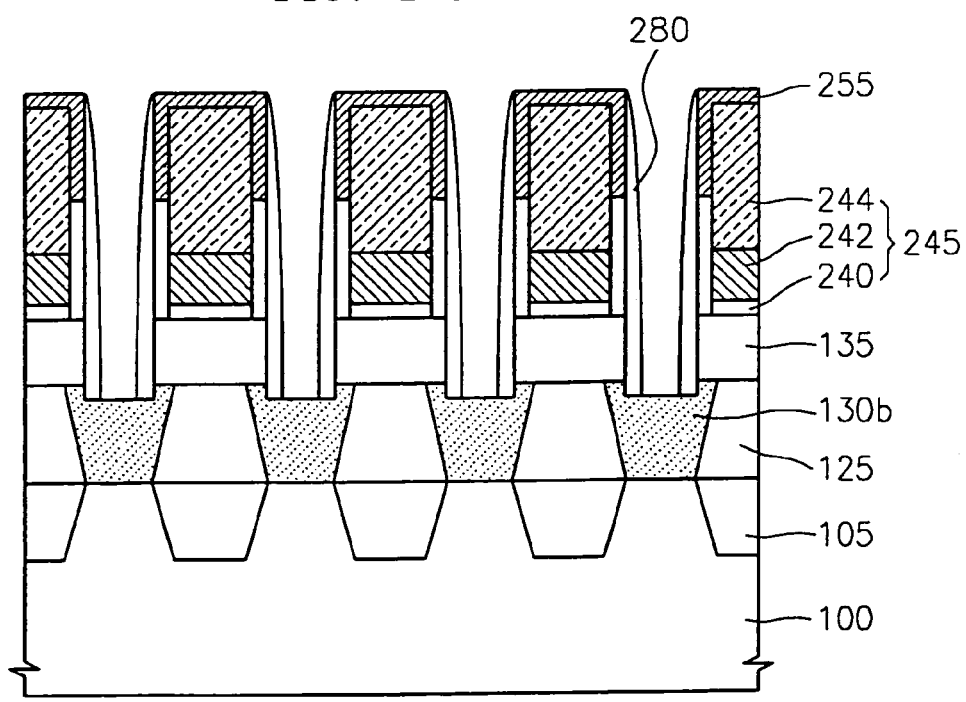
Figure 12F:
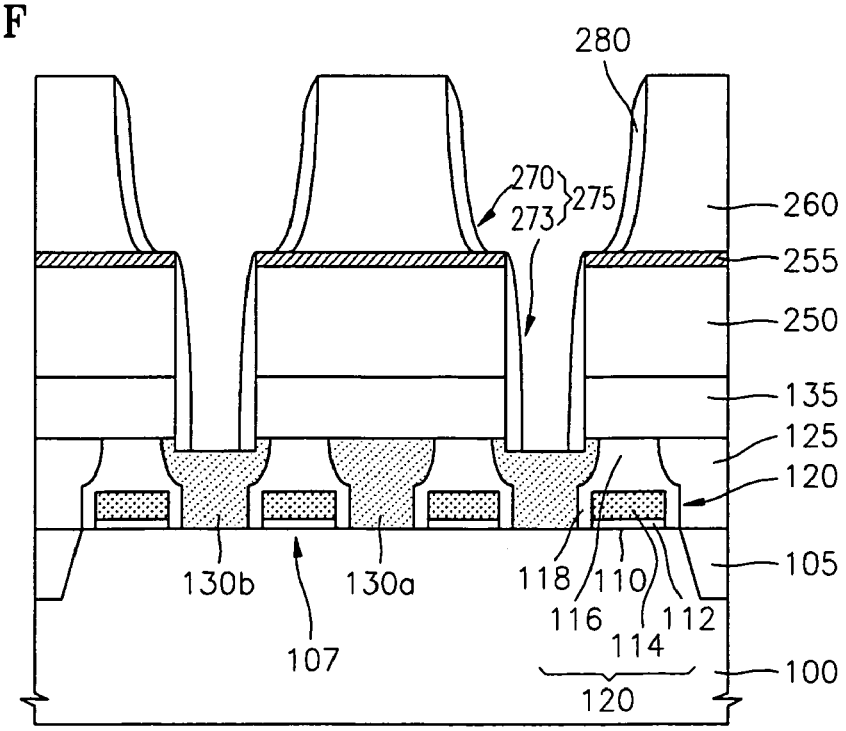

Thereafter, as shown in FIGS. 11F and 12F, an insulating layer, for example, a silicon oxide layer or a silicon nitride layer, is deposited on the resultant structure to a thin thickness and then anisotropically etched using a blanket method. Thus, contact spacers 280 are formed on the sidewalls of the preliminary bit line structures 245 and the sidewalls of the storage node contact holes 275. The contact spacers 280 define complete bit line structures and cover a conductive layer 142 for bit lines, which may be exposed during processes. As a result, a short can be prevented between storage node contact plugs to be formed later and the conductive layer 142 for the bit lines.

Figure 11G:
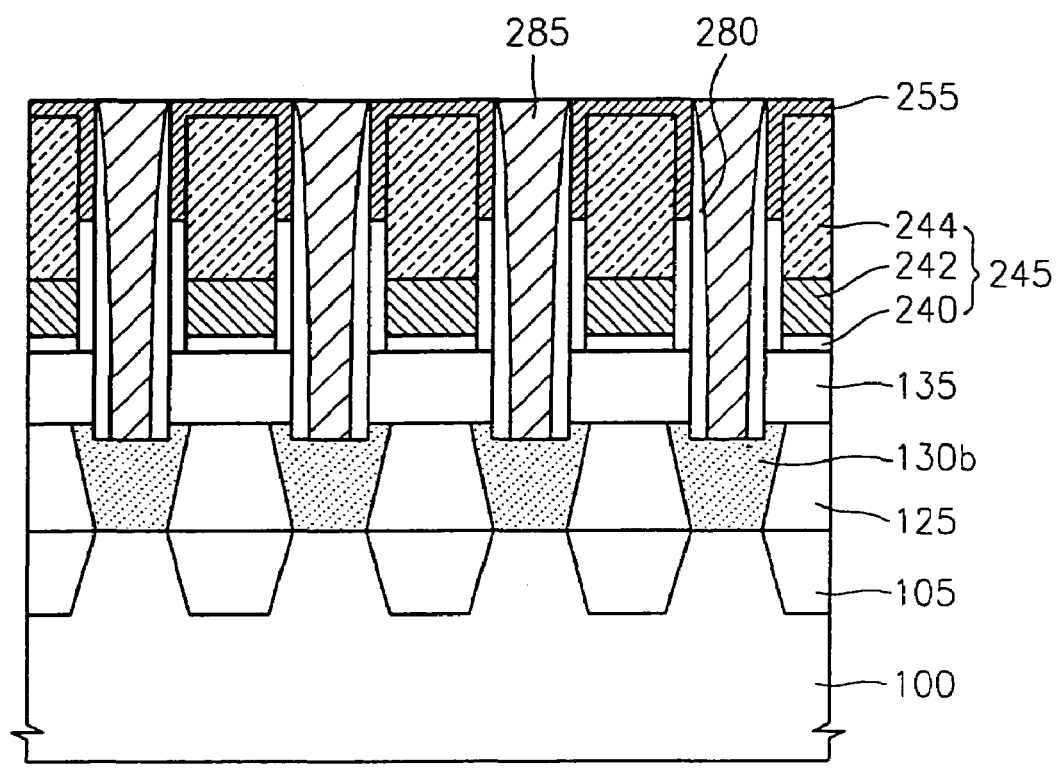
Figure 12G:
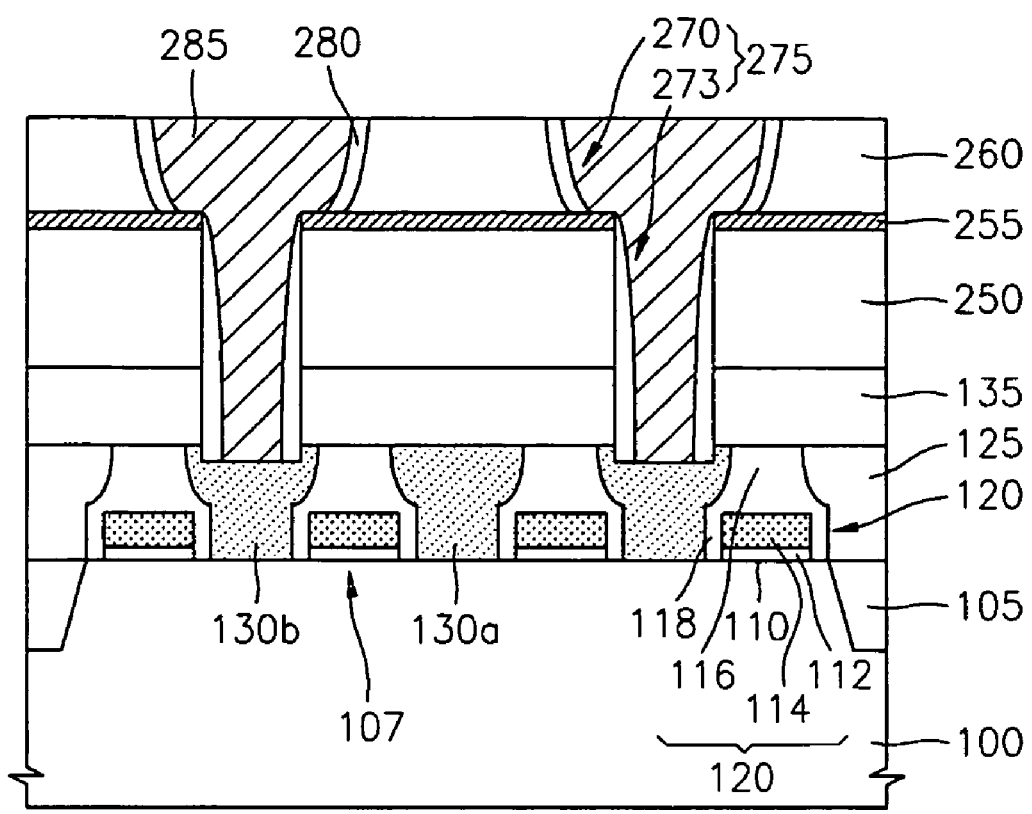

As shown in FIGS. 11G and 12G, a conductive layer, for example, a doped polysilicon layer is deposited on the resultant structure to contact the exposed second contact pads 130b. The conductive layer is then polished using CMP until the surfaces of the bit line structures are exposed, thereby forming storage node contact plugs 285. Here, in a direction parallel to the bit line structures (FIG. 12G), the storage node contact plugs 285 are formed such that their entrance portions are larger than their contacting portions.

Thereafter, although not shown in the drawings, storage node electrodes are formed in the same manner as the embodiment illustrated in FIGS. 7 and 8.

FIGS. 13A through 13D and 14A through 12D are cross-sectional diagrams illustrating a method of manufacturing storage node contact plugs of a DRAM memory cell according to a different embodiment of the invention. Here, FIGS. 13A through 13G are cross-sectional diagrams taken in a direction parallel to word line structures, and FIGS. 14A through 14D are cross-sectional diagrams taken in a direction parallel to bit line structures. In this embodiment, since steps of forming a device isolation region 105 through forming a hard mask layer 144 for bit lines are performed in the same manner as the embodiments illustrated in FIGS. 6-12, the detailed description will be omitted here.

Figure 13A:
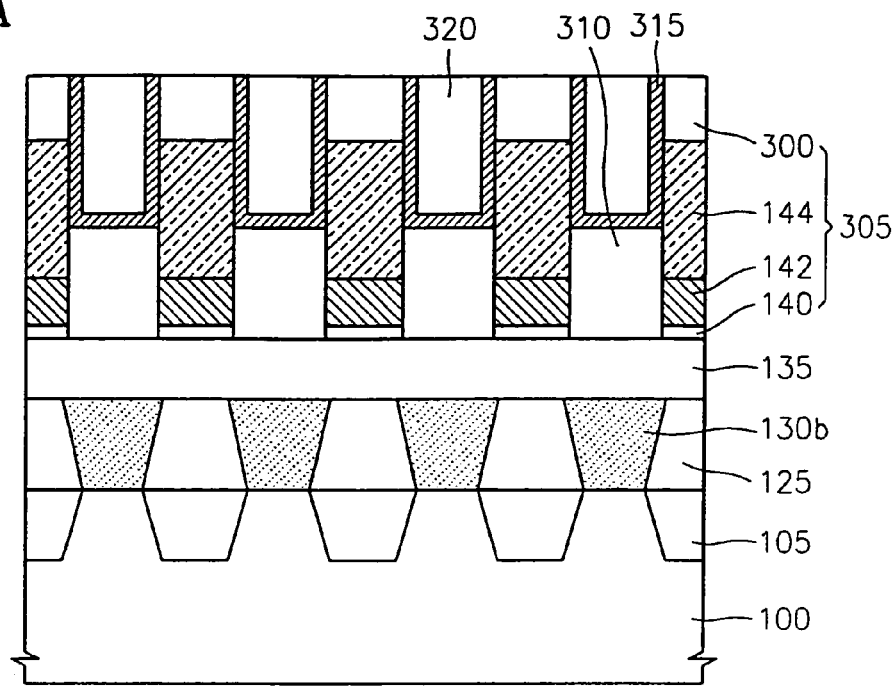
FIGS. 13A through 13D are cross-sectional diagrams illustrating a different embodiment of the invention, taken in a direction parallel to word line structures.
Figure 14A:
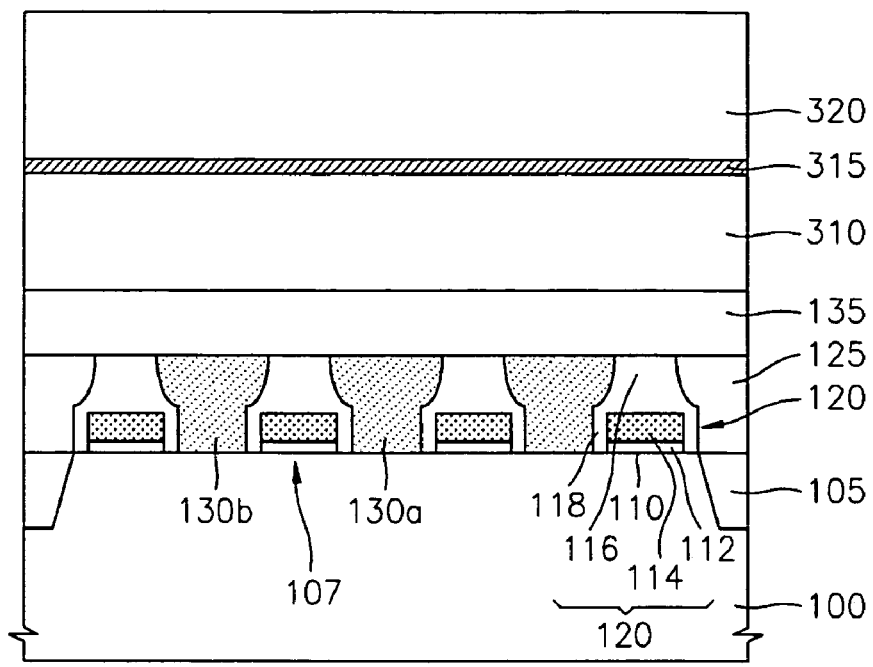
FIGS. 14A through 14D are cross-sectional diagrams illustrating a different embodiment of the invention, taken in a direction parallel to bit line structures.

As shown in FIGS. 13A and 14A, a barrier metal layer 140, a conductive layer 142 for bit lines, a hard mask layer 144, and a protection layer 300 are sequentially stacked on a second ILD 135. The protection layer 300 may be formed of a material having a high etch selectivity with respect to ILDs formed of silicon oxide, for example, polysilicon. The protection layer 300, the hard mask layer 144, the conductive layer 142 for the bit lines, and the barrier metal layer 140 are patterned in the shape of bit lines, thereby forming preliminary bit line structures 305. Next, a third ILD 310 is formed to partially fill the gaps between the preliminary bit line structures 305. The second ILD 135 and the third ILD 310 may be formed of, for example, silicon oxide. An etch stopper 315 is formed on the third ILD 310 and the preliminary bit line structures 305. The etch stopper 315 may be formed of a material with an etch selectivity different from that of the third ILD 310, for example, silicon nitride. A fourth ILD 320 is deposited on the etch stopper 315. In this embodiment, the fourth ILD 320 may be formed of, for example, silicon oxide. The fourth ILD 320 is formed to a sufficient thickness so as to fill the gaps between the bit line structures 305. Thereafter, the fourth ILD 320 is polished using CMP until the surface of the fourth ILD 320 is exposed.

Figure 13B:
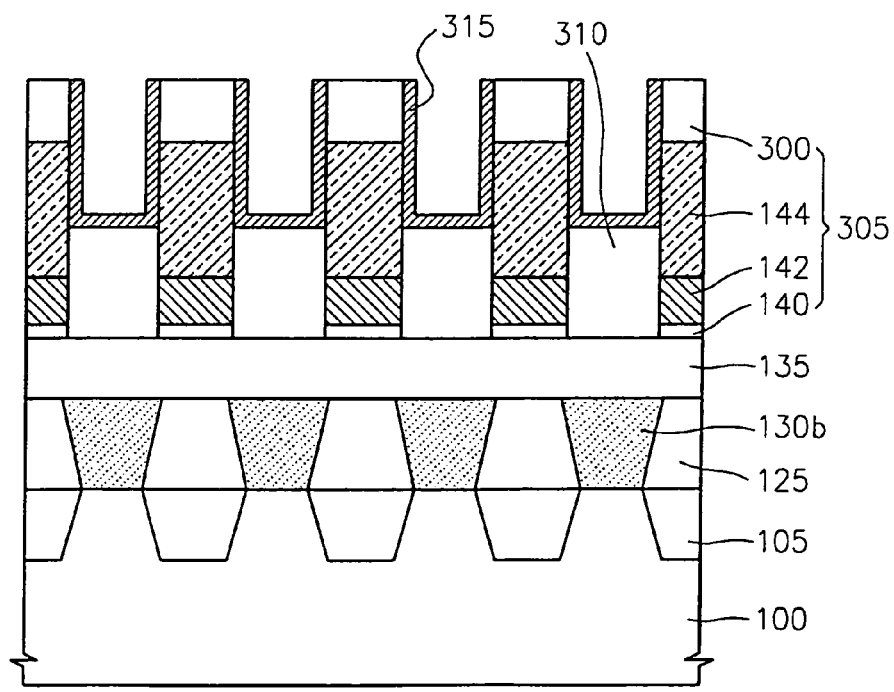
Figure 14B:
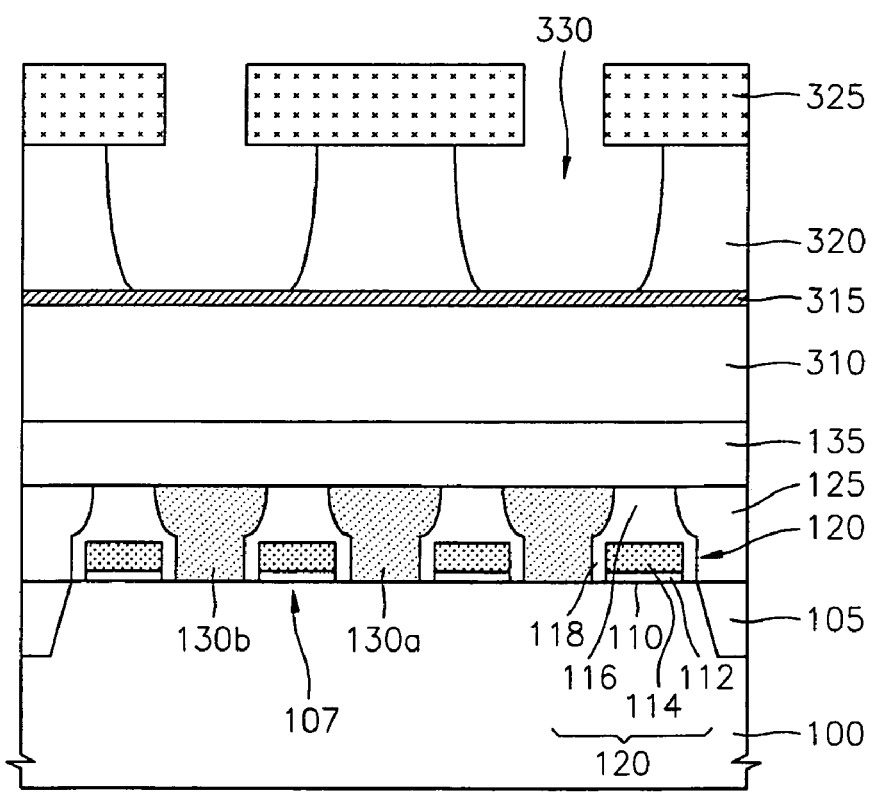

Thereafter, referring to FIGS. 13B and 14B, a photoresist pattern 325 is formed by a conventional method on the fourth ILD 320 to define storage node contact holes. The photoresist pattern 325 may be disposed in the same manner as the embodiment illustrated in FIGS. 6, 7, and 8. By using the photoresist pattern 325 as an etch mask, the fourth ILD 320 is anisotropically etched using a dry etch process by a predetermined thickness and then isotropically etched using a wet etch process. Thus, entrance portions 330 of storage node contact holes are formed. During the wet etch process, while the third ILD 310 is protected by the etch stopper 315, the etch stopper 315 is removed to a predetermined thickness.

Figure 13C:
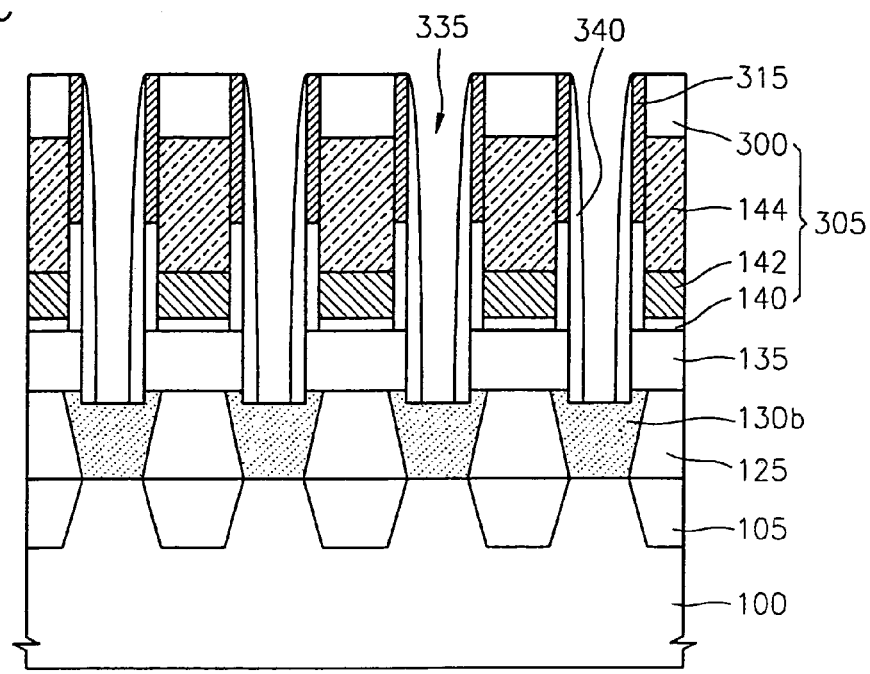
Figure 14C:
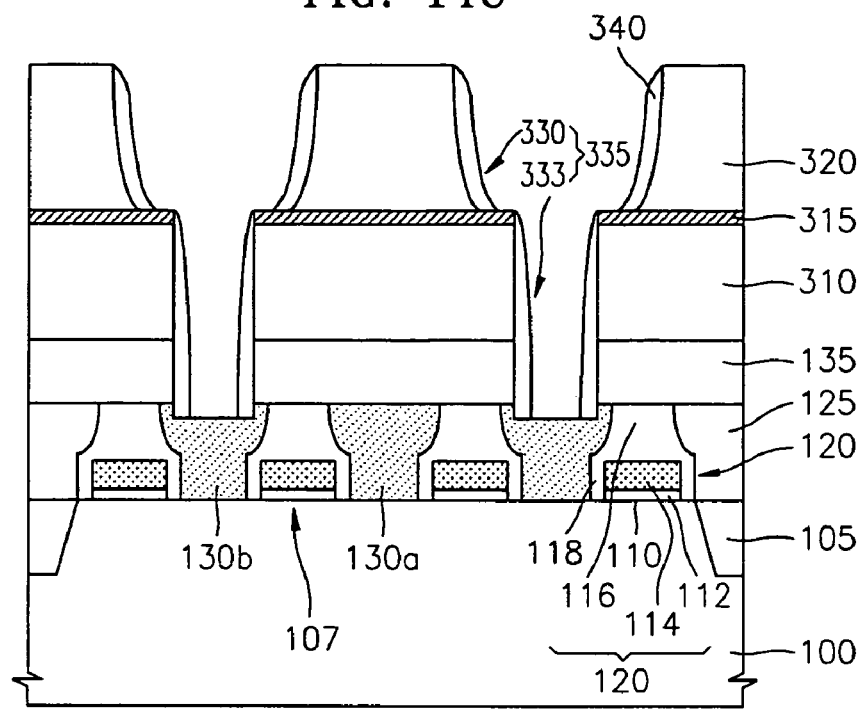

Thereafter, as shown in FIGS. 13C and 14C, the etch stopper 315, the third ILD 310, and the second ILD 135 are anisotropically etched using a dry etch process in the shape of the photoresist pattern 325, thereby exposing second contact pads 130b. Thus, storage node contact holes 335 are formed such that the diameter of entrance portions 330 is greater than that of contacting portions 333. As shown in FIG. 14C, in a view taken in a direction parallel to bit lines, the storage node contact holes 335 have a Y-shaped section. Thereafter, an insulating layer is deposited on the resultant structure to a thin thickness and then anisotropically etched using a blanket method. Thus, contact spacers 340 are formed on the sidewalls of the preliminary bit line structures 305 and both sidewalls of the storage node contact holes 335. As a result, complete bit line structures are defined.

Figure 13D:
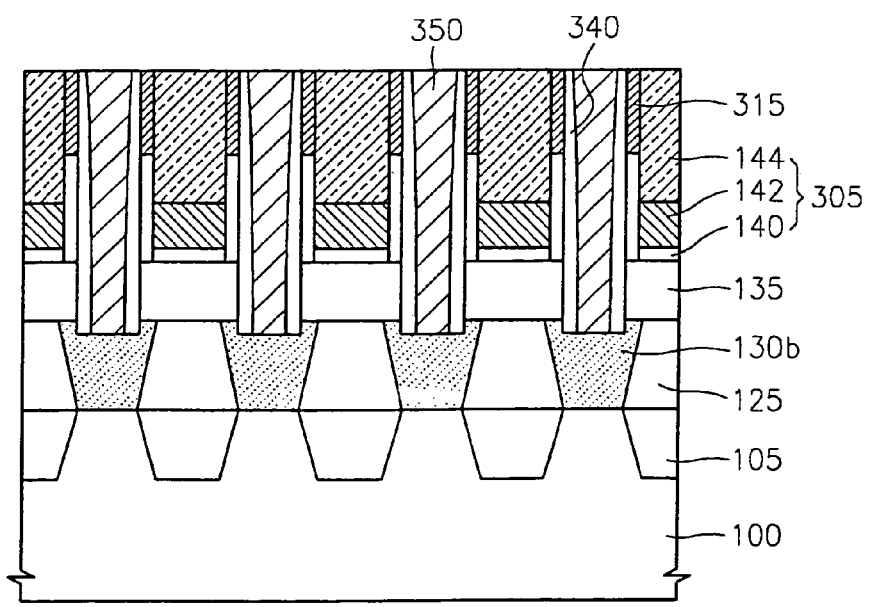
Figure 14D:
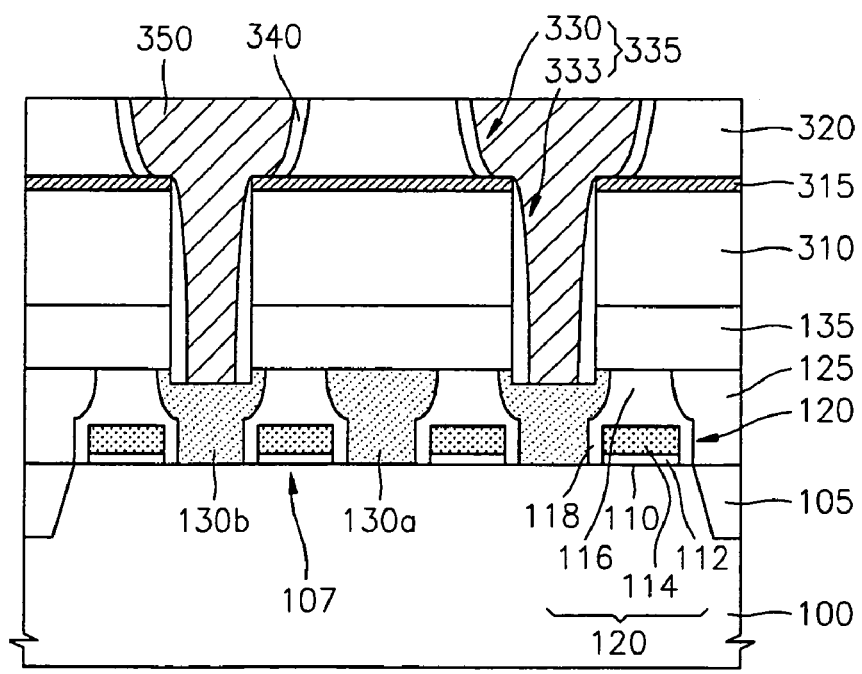

Referring to FIGS. 13D and 14D, a conductive layer, for example, a doped polysilicon layer is deposited on the resultant structure, where the storage node contact holes 335 are formed, to fill the storage node contact holes 335. The conductive layer is then polished using CMP until the hard mask layer 144 of the bit line structures is exposed. As a result, Y-shaped storage node contact plugs 350 are formed.

According to embodiments of the invention, while the diameter of the contacting portion remains the same as the conventional contacting portion, the diameter of the entrance portion extends in a direction parallel to bit lines. Also, the storage node electrodes in the same row are disposed in a zigzag fashion so that the storage node electrodes throughout the substrate are diagonally arranged. Thus, a predetermined margin between adjacent storage node electrodes can be secured in the X-axis and Y-axis directions. Consequently, reliable insulation is enabled between the adjacent storage node electrodes, and the storage node electrodes can be increased in size.

Embodiments of the invention will now be described in a non-limiting way.

According to an embodiment of the invention, a DRAM memory cell includes a semiconductor substrate where a plurality of active regions are defined; a plurality of word line structures, which are disposed on the semiconductor substrate to cross over the active regions; first contact pads and second contact pads, each of which is formed in each of the active regions on both sides of the word line structures; bit line structures, which are electrically connected to the first contact pads, electrically isolated from the word line structures, and disposed perpendicularly to the word line structures; an interlayer dielectric layer (ILD), which is formed on the semiconductor substrate where the bit line structures are formed; storage node contact plugs, which penetrate the ILD and are connected to the second contact pads; and storage node electrodes, which are formed on the storage node contact plugs to contact the storage node contact plugs. In a direction parallel to the bit line structures, the storage node contact plugs are formed such that their entrance portions are formed to be larger in linewidth than their contacting portions. Also, in a direction parallel to the word line structures, the storage node contact plugs are formed in gaps between the bit line structures.

According to another embodiment of the invention, a DRAM memory cell includes a semiconductor substrate where a plurality of active regions are defined; a plurality of word line structures, which are disposed on the semiconductor substrate to cross over the active regions; first contact pads and second contact pads, each of which is formed in each of the active regions on both sides of the word line structures; bit line structures, which are electrically connected to the first contact pads, electrically isolated from the word line structures, and disposed perpendicularly to the word line structures; an ILD, which is formed on the semiconductor substrate where the bit line structures are formed; storage node contact plugs, which penetrate the ILD and are connected to the second contact pads; and storage node electrodes, which are formed on the storage node contact plugs to contact the storage node contact plugs. In a direction parallel to the bit line structures, the storage node contact plugs are formed such that their entrance portions are formed to be larger in linewidth than their contacting portions. In a direction parallel to the word line structures, the storage node contact plugs are formed in gaps between the bit line structures. Also, from a plan view perspective, the storage node electrodes of a column are disposed on a lower portion of the storage node contact plugs in the same column, while the storage node electrodes of a neighboring column are disposed on an upper portion of the storage node contact plugs in the neighboring column. Consequently, the storage node electrodes are diagonally disposed throughout the substrate.

Each of the active regions appears as a rough "T" shape, rotated by 90°. The active regions in every column are arranged to partially fill gaps between the active regions in an adjacent column. Also, each active region is overlapped by a pair of word line structures.

The DRAM memory cell further includes contact spacers between the storage node contact plugs and the ILD and between the storage node contact plugs and the bit line structures.

In accordance with another aspect of the invention, there is provided a method of manufacturing a DRAM memory cell. According to an embodiment, the method includes forming word line structures on a semiconductor substrate where active regions are defined; forming drains and sources in the active regions on both sides of the word line structures; forming a first ILD on the semiconductor substrate where the word line structures are formed; forming first contact pads and second contact pads in the first ILD to contact the drains and sources, respectively; forming a second ILD on the semiconductor substrate where the first contact pads and the second contact pads are formed; forming bit line structures on the second ILD, the bit line structures being disposed perpendicularly to the word lines and being electrically connected to the first contact pads; depositing an insulating layer on the second ILD on which the bit line structures are formed; forming storage node contact holes, which expose the second contact pads, by etching the insulating layer such that, in a direction parallel to the bit line structures, entrance portions of the storage node contact holes are wide and contacting portions thereof are narrow; forming storage node contact plugs by filling the storage node contact holes with a conductive material; and forming storage node electrodes to contact the storage node plugs.

According to another embodiment, a method of manufacturing a DRAM memory cell includes forming a plurality of word line structures on a semiconductor substrate where active regions are defined; forming drains and sources, in the active regions on both sides of the word line structures; forming a first ILD on the semiconductor substrate where the word line structures are formed; forming first contact pads and second contact pads in the first ILD to contact the drains and the sources, respectively; forming a second ILD on the semiconductor substrate where the first contact pads and the second contact pads are formed; forming bit line structures on the second ILD, the bit line structures being disposed perpendicularly to the word line structures and being electrically connected to the first contact pads; depositing a third ILD on the second ILD on which the bit line structures are formed so as to partially fill the gaps between the bit line structures; depositing a fourth ILD on the third ILD to fill up the gaps between the bit line structures, the fourth ILD being wet etched at a higher rate than the third ILD; forming a photoresist pattern on the fourth ILD to open the second contact pads; isotropically etching the fourth ILD using the photoresist pattern as an etch mask; forming storage node contact holes by anisotropically etching the exposed third ILD and the second ILD using the photoresist pattern as an etch mask; removing the photoresist pattern; forming storage node contact plugs by filling the storage node contact holes with a conductive material; and forming storage node electrodes to contact the storage node plugs.

According to yet another embodiment, a method of manufacturing a DRAM memory cell includes forming a plurality of word line structures on a semiconductor substrate where active regions are defined; forming drains and sources in the active regions on both sides of the word line structures; forming a first ILD on the semiconductor substrate on which the word line structures are formed; forming first contact pads and second contact pads in the first ILD to contact the drains and sources, respectively; forming a second ILD on the semiconductor substrate where the first contact pads and the second contact pads are formed; forming bit line structures on the second ILD, the bit line structures being disposed perpendicularly to the word line structures and being electrically connected to the first contact pads; depositing a third ILD on the second ILD where the bit line structures are formed so as to partially fill the gaps between the bit line structures; depositing a fourth ILD on the third ILD to fill up the gaps between the bit line structures, the fourth ILD being wet etched at a higher rate than the third ILD; forming a photoresist pattern on the fourth ILD to open the second contact pads; forming storage node contact holes by anisotropically etching the fourth ILD and the third ILD using the photoresist pattern as an etch mask; removing the photoresist pattern; wet etching the exposed fourth ILD and the third ILD by a predetermined thickness; forming storage node contact plugs by filling the storage node contact holes with a conductive material; and forming storage node electrodes to contact the storage node plugs.

According to still another embodiment, a method of manufacturing a DRAM memory cell comprises forming a plurality of word line structures on a semiconductor substrate where active regions are defined; forming drains and sources in the active regions on both sides of the word line structures; forming a first ILD on the semiconductor substrate on which the word line structures are formed; forming first contact pads and second contact pads in the first ILD to contact the drains and the sources, respectively; forming a second ILD on the semiconductor substrate where the first contact pads and the second contact pads are formed; forming bit line structures on the second ILD, the bit line structures being disposed perpendicularly to the word line structures and being electrically connected to the first contact pads; depositing a third ILD on the second ILD on which the bit line structures are formed to partially fill the gaps between the bit line structures; forming an etch stopper on the third ILD and the exposed surfaces of the bit line structures; depositing a fourth ILD on the etch stopper to sufficiently fill the gaps between the bit line structures; forming a photoresist pattern on the fourth ILD so as to expose regions corresponding to the second contact pads; anisotropically etching a portion of the fourth ILD using the photoresist pattern as an etch mask; forming entrance portions of storage node contact holes by isotropically etching the fourth ILD using the photoresist pattern as an etch mask; completing the storage node contact holes by forming contacting portions by anisotropically etching the etch stopper, the third ILD, and the second ILD using the photoresist pattern as an etch mask; removing the photoresist pattern; and forming storage node contact plugs in the storage node contact holes.

While the invention has been particularly shown and described with reference to preferred embodiments thereof, it will be understood by those of ordinary skill in the art that various changes in form and details may be made therein without departing from the spirit and scope of the invention as defined by the following claims.

The invention claimed is:

1. A method of manufacturing a DRAM memory cell, the method comprising:
   forming word line structures on a semiconductor substrate where active regions are defined;
   forming drains and sources in the active regions on both sides of the word line structures;
   forming a first interlayer dielectric on the semiconductor substrate where the word line structures are formed;
   forming first contact pads and second contact pads in the first interlayer dielectric to contact the drains and sources, respectively;
   forming a second interlayer dielectric on the semiconductor substrate where the first contact pads and the second contact pads are formed;
   forming bit line structures on the second interlayer dielectric, the bit line structures being disposed perpendicularly to the word lines and being electrically connected to the first contact pads;
   depositing an insulating layer on the second interlayer dielectric on which the bit line structures are formed;
   forming storage node contact holes that expose the second contact pads by etching the insulating layer such that an entrance portion of the storage node contact holes extends in a direction parallel to a longitudinal axis of the bit line structures so as to be wider than a contact portion of the storage node contact holes;
   forming storage node contact plugs by filling the storage node contact holes with a conductive material; and
   forming storage node electrodes to contact the storage node plugs.

2. The method of claim 1, wherein depositing the insulating layer comprises:
   depositing a third interlayer dielectric on the second interlayer dielectric to partially fill the gaps between the bit line structures; and
   depositing a fourth interlayer dielectric on the third interlayer dielectric to completely fill the gaps between the bit line structures, the fourth interlayer dielectric being wet etched at a higher rate than the third interlayer dielectric.

3. The method of claim 2, wherein forming the storage node contact holes comprises:
   forming a photoresist pattern on the fourth interlayer dielectric so as to expose regions corresponding to the second contact pads;
   isotropically etching the fourth interlayer dielectric using the photoresist pattern as an etch mask;
   anisotropically etching the third interlayer dielectric; and
   removing the photoresist pattern.

4. The method of claim 2, wherein forming the storage node contact holes comprises:
   forming a photoresist pattern on the fourth interlayer dielectric so as to expose regions corresponding to the second contact pads;
   anisotropically etching the exposed fourth interlayer dielectric and the third interlayer dielectric using the photoresist pattern as an etch mask;
   removing the photoresist pattern; and
   wet etching the exposed fourth interlayer dielectric and the third interlayer dielectric.

5. The method of claim 1, wherein forming the insulating layer comprises:
   forming a third interlayer dielectric so as to partially fill the gaps between the bit line structures;
   depositing an etch stopper on the third interlayer dielectric and the exposed surface of the bit line structures; and
   depositing a fourth interlayer dielectric on the etch stopper to completely fill the gaps between the bit line structures.

6. The method of claim 5, wherein the fourth interlayer dielectric has an etch selectivity that is similar to that of the third interlayer dielectric.

7. The method of claim 5, wherein forming the storage node contact holes comprises:
   forming a photoresist pattern on the fourth interlayer dielectric so as to expose regions corresponding to the second contact pads;
   anisotropically etching the fourth interlayer dielectric by a predetermined thickness using the photoresist pattern as an etch mask;
   isotropically etching the fourth interlayer dielectric until the etch stopper is etched; and
   anisotropically etching the etch stopper, the third interlayer dielectric, and the second interlayer dielectric using the photoresist pattern as an etch mask.

8. The method of claim 7, further comprising forming a polysilicon layer as a protection layer on the bit line structures.

9. The method of claim 1, further comprising, between forming the storage node contact holes and forming storage node contact plugs: forming contact spacers using an insulating layer on the sidewalls of the storage node contact holes and the sidewalls of the bit line structures.

10. The method of claim 9, wherein forming the storage node contact plugs comprises:
    depositing a conductive layer to fill the storage node contact holes; and
    polishing the conductive layer using chemical mechanical polishing until the surfaces of the bit line structures are exposed.

11. A method of manufacturing a DRAM memory cell, the method comprising:
    forming a plurality of word line structures on a semiconductor substrate where active regions are defined;
    forming drains and sources in the active regions on both sides of the word line structures;
    forming a first interlayer dielectric on the semiconductor substrate where the word line structures are formed;
    forming first contact pads and second contact pads in the first interlayer dielectric to contact the drains and the sources, respectively;
    forming a second interlayer dielectric on the semiconductor substrate where the first contact pads and the second contact pads are formed;
    forming bit line structures on the second interlayer dielectric, the bit line structures being disposed perpendicular to the word line structures and being electrically connected to the first contact pads;
    depositing a third interlayer dielectric on the second interlayer dielectric on which the bit line structures are formed so as to partially fill the gaps between the bit line structures;
    depositing a fourth interlayer dielectric on the third interlayer dielectric to completely fill the gaps between the bit line structures, the fourth interlayer dielectric being wet etched at a higher rate than the third interlayer dielectric;
    forming a photoresist pattern on the fourth interlayer dielectric to open the second contact pads;
    isotropically etching the fourth interlayer dielectric using the photoresist pattern as an etch mask;
    forming storage node contact holes by anisotropically etching the exposed third interlayer dielectric and the second interlayer dielectric using the photoresist pattern as an etch mask;
    removing the photoresist pattern;
    forming storage node contact plugs by filling the storage node contact holes with a conductive material; and
    forming storage node electrodes to contact the storage node plugs.

12. A method of manufacturing a DRAM memory cell, the method comprising:
    forming a plurality of word line structures on a semiconductor substrate where active regions are defined;
    forming drains and sources in the active regions on both sides of the word line structures;
    forming a first interlayer dielectric on the semiconductor substrate on which the word line structures are formed;
    forming first contact pads and second contact pads in the first interlayer dielectric to contact the drains and sources, respectively;
    forming a second interlayer dielectric on the semiconductor substrate where the first contact pads and the second contact pads are formed;
    forming bit line structures on the second interlayer dielectric, the bit line structures being disposed perpendicularly to the word line structures and being electrically connected to the first contact pads;
    depositing a third interlayer dielectric on the second interlayer dielectric where the bit line structures are formed so as to partially fill the gaps between the bit line structures;
    depositing a fourth interlayer dielectric on the third interlayer dielectric to completely fill the gaps between the bit line structures, the fourth interlayer dielectric being wet etched at a higher rate than the third interlayer dielectric;
    forming a photoresist pattern on the fourth interlayer dielectric to open the second contact pads;

forming storage node contact holes by anisotropically etching the fourth interlayer dielectric and the third interlayer dielectric using the photoresist pattern as an etch mask;

removing the photoresist pattern;

wet etching the exposed fourth interlayer dielectric and the third interlayer dielectric by a predetermined thickness;

forming storage node contact plugs by filling the storage node contact holes with a conductive material; and forming storage node electrodes to contact the storage node plugs.

* * * * *